United States Patent
Sumita

(10) Patent No.: US 8,067,976 B2
(45) Date of Patent: Nov. 29, 2011

(54) SEMICONDUCTOR INTEGRATED CIRCUIT

(75) Inventor: Masaya Sumita, Hyogo (JP)

(73) Assignee: Panasonic Corporation, Osaka (JP)

( * ) Notice: Subject to any disclaimer, the term of this patent is extended or adjusted under 35 U.S.C. 154(b) by 735 days.

(21) Appl. No.: 11/997,502

(22) PCT Filed: Jul. 31, 2006

(86) PCT No.: PCT/JP2006/315104
§ 371 (c)(1),
(2), (4) Date: Jan. 31, 2008

(87) PCT Pub. No.: WO2007/015442
PCT Pub. Date: Feb. 8, 2007

(65) Prior Publication Data
US 2010/0097128 A1  Apr. 22, 2010

(30) Foreign Application Priority Data
Aug. 2, 2005 (JP) .................................. 2005-224020

(51) Int. Cl.
*G05F 3/02* (2006.01)
(52) U.S. Cl. ...................................... 327/535; 327/537
(58) Field of Classification Search .................. 327/534, 327/535
See application file for complete search history.

(56) References Cited

U.S. PATENT DOCUMENTS

| | | | |
|---|---|---|---|
| 5,682,118 A * | 10/1997 | Kaenel et al. | 327/534 |
| 6,147,508 A * | 11/2000 | Beck et al. | 326/32 |
| 6,784,744 B2 * | 8/2004 | Tichauer | 330/285 |
| 7,106,128 B2 * | 9/2006 | Tschanz et al. | 327/534 |

(Continued)

FOREIGN PATENT DOCUMENTS

JP  2004-165649  6/2004
(Continued)

OTHER PUBLICATIONS

Sumita, M., et al., "Mixed Body-Bias Techniques with Fixed $V_t$ and $I_{ds}$ Generation Circuits," ISSCC Digest of Technical Papers, Feb. 2004, 10 pages 0-7803-8267-6/04, 2004 IEEE International Solid-State Circuits Conference, IEEE.

(Continued)

*Primary Examiner* — Thomas J Hiltunen
(74) *Attorney, Agent, or Firm* — McDermott Will & Emery LLP

(57) ABSTRACT

A semiconductor integrated circuit (1) comprises a substrate voltage control circuit (10A), a drain current adjuster (E1), a MOS device characteristic detection circuit (20), and a drain current compensator (E2). The substrate voltage control circuit (10A) has at least one substrate voltage supply MOS device (m1) for controlling the supply of the substrate voltage of the semiconductor integrated circuit (1). The drain current adjuster (E1) adjusts the drain current of the substrate voltage supply MOS device (m1) by controlling the substrate voltage of the substrate voltage supply MOS device (m1). The MOS device characteristic detection circuit (20) has a characteristic detection device (m2) for detecting the characteristics of the substrate voltage supply MOS device (m1). The drain current compensator (E2) corrects the drain current of the substrate voltage supply MOS device (m1) by controlling the substrate voltage of the substrate voltage supply MOS device (m1) according to the characteristics of the substrate voltage supply MOS device (m1) detected by the MOS device characteristic detection circuit (20).

34 Claims, 14 Drawing Sheets

U.S. PATENT DOCUMENTS

| | | |
|---|---|---|
| 7,501,880 B2 * | 3/2009 | Bonaccio et al. ............. 327/534 |
| 7,504,876 B1 * | 3/2009 | Raghavan et al. ............ 327/536 |
| 7,514,953 B2 * | 4/2009 | Perisetty ........................ 326/27 |
| 7,564,296 B2 * | 7/2009 | Ito ................................. 327/534 |
| 7,746,160 B1 * | 6/2010 | Raghavan et al. ............ 327/534 |
| 7,796,073 B2 * | 9/2010 | Ogawa et al. ................. 341/144 |
| 7,816,936 B2 * | 10/2010 | Ito ............................... 324/750.3 |
| 2004/0135621 A1 * | 7/2004 | Sumita et al. ................. 327/534 |
| 2005/0116765 A1 * | 6/2005 | Sakiyama et al. ............ 327/534 |
| 2006/0125550 A1 | 6/2006 | Sumita et al. |
| 2006/0125551 A1 | 6/2006 | Sumita et al. |
| 2010/0097128 A1 * | 4/2010 | Sumita ........................ 327/537 |

FOREIGN PATENT DOCUMENTS

JP  2005-197411  7/2005

OTHER PUBLICATIONS

Tschanz, J., et al., "Adaptive Body Bias for Reducing Impacts of Die-to Die and Within-Die Parameter Variations on Microprocessor Frequency and Leakage," ISSCC Digest of Technical Papers, Feb. 2002, 3 pages 0-7803-7335-9, 2002 IEEE International Solid-State Circuits Conference, IEEE.

* cited by examiner

F I G. 2 A
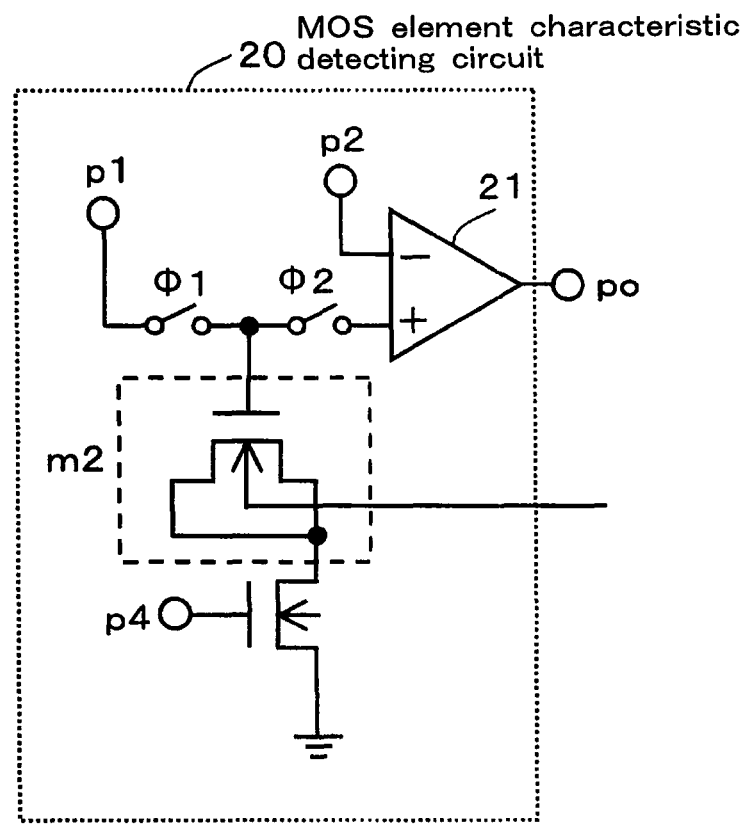
F I G. 2 B
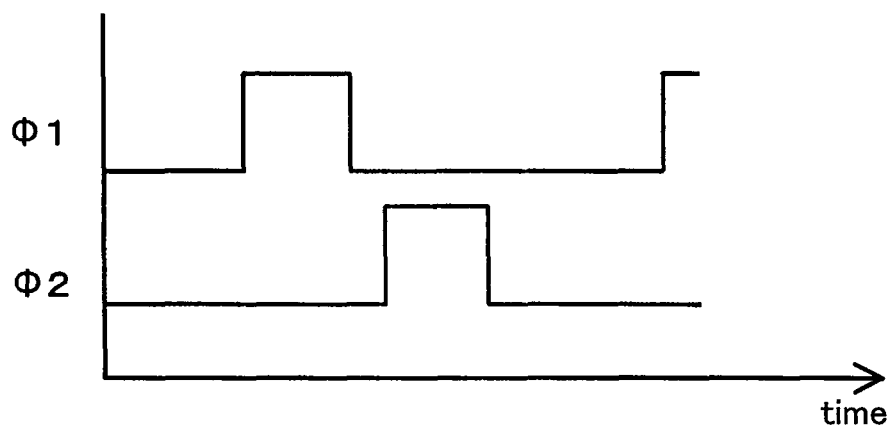

F I G. 5
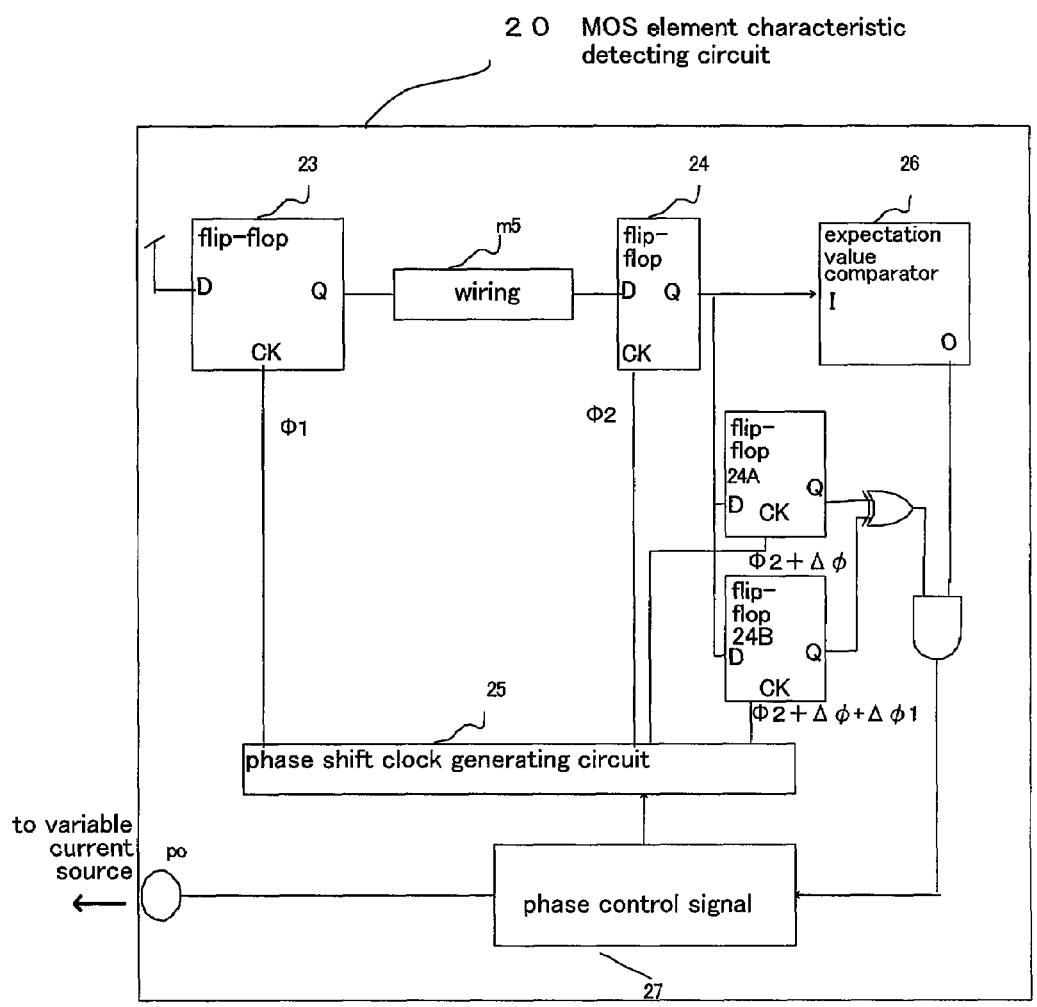

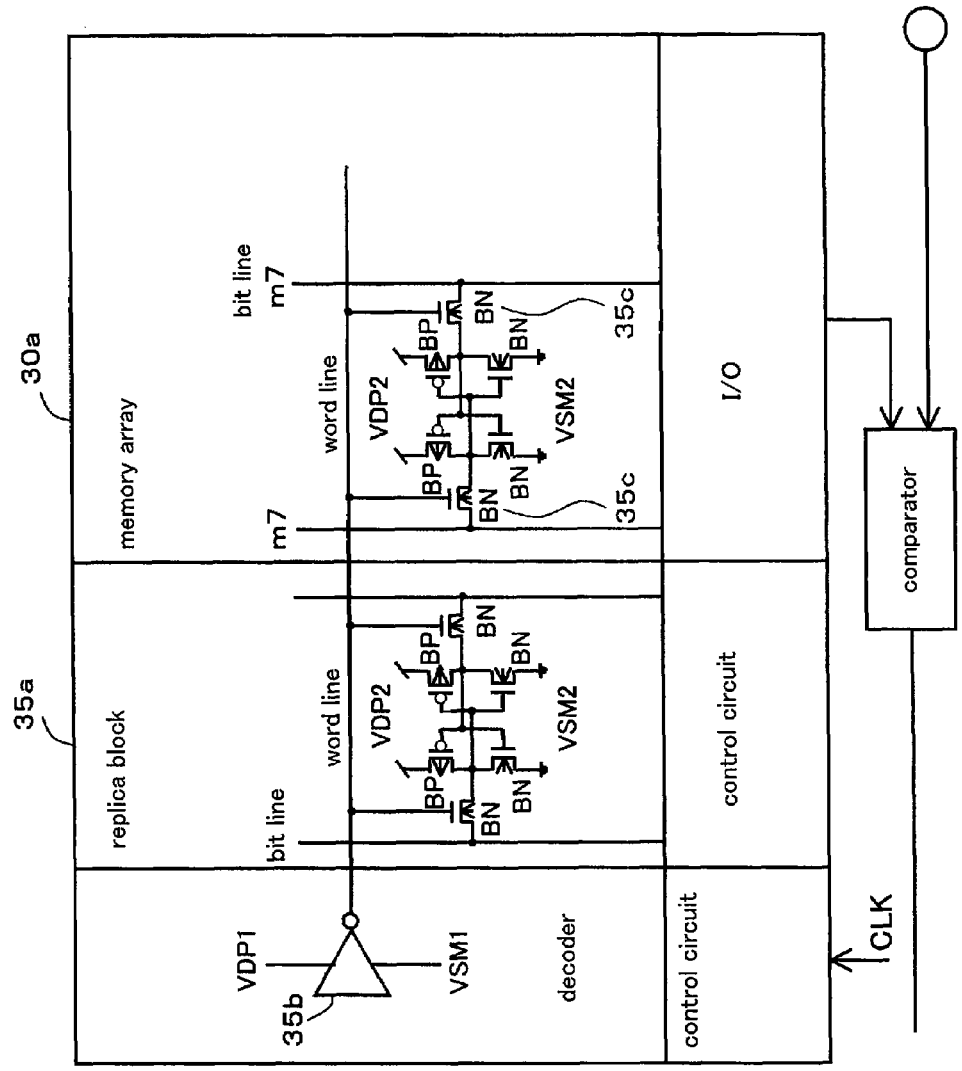

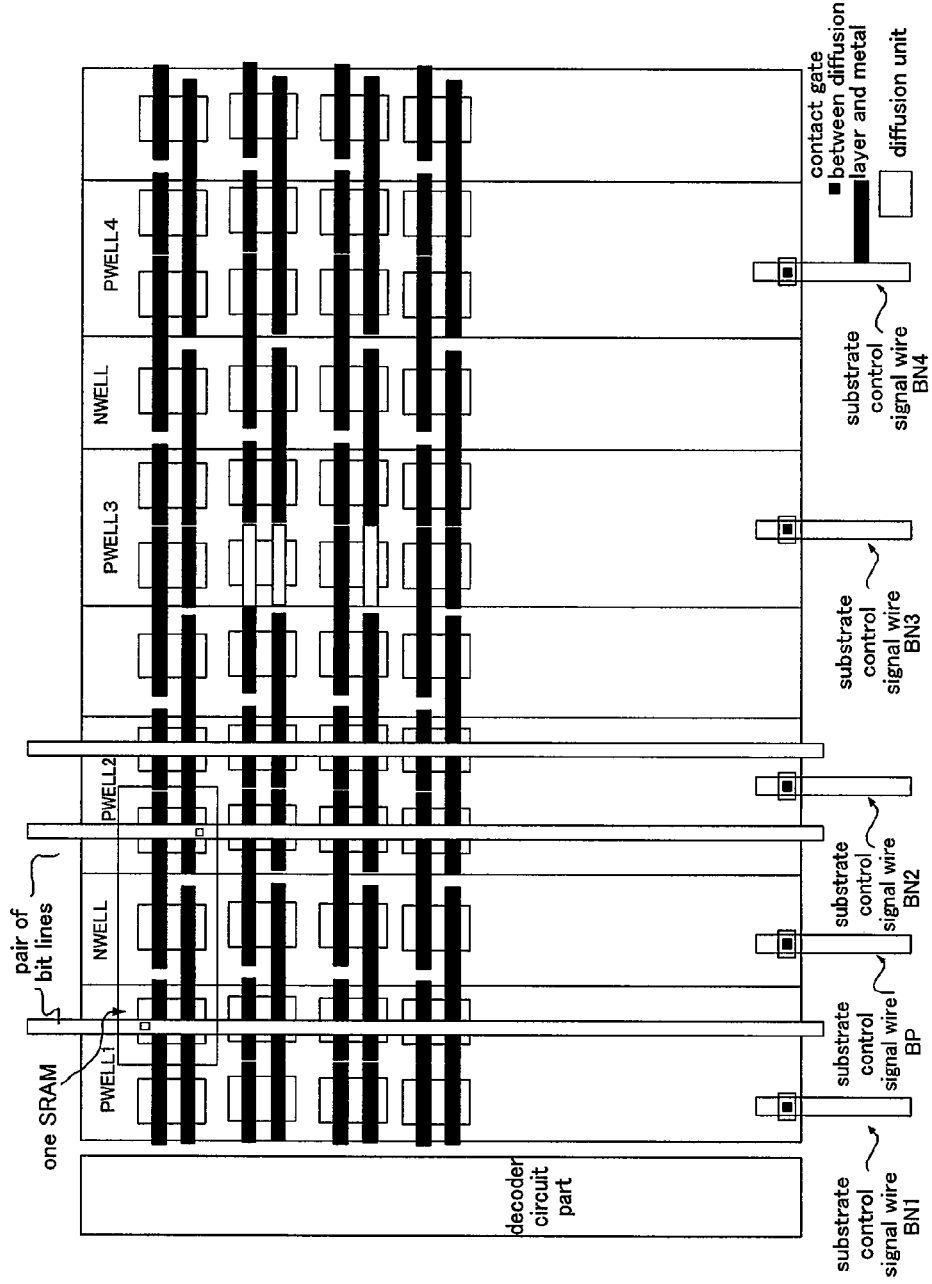

F I G. 1 0
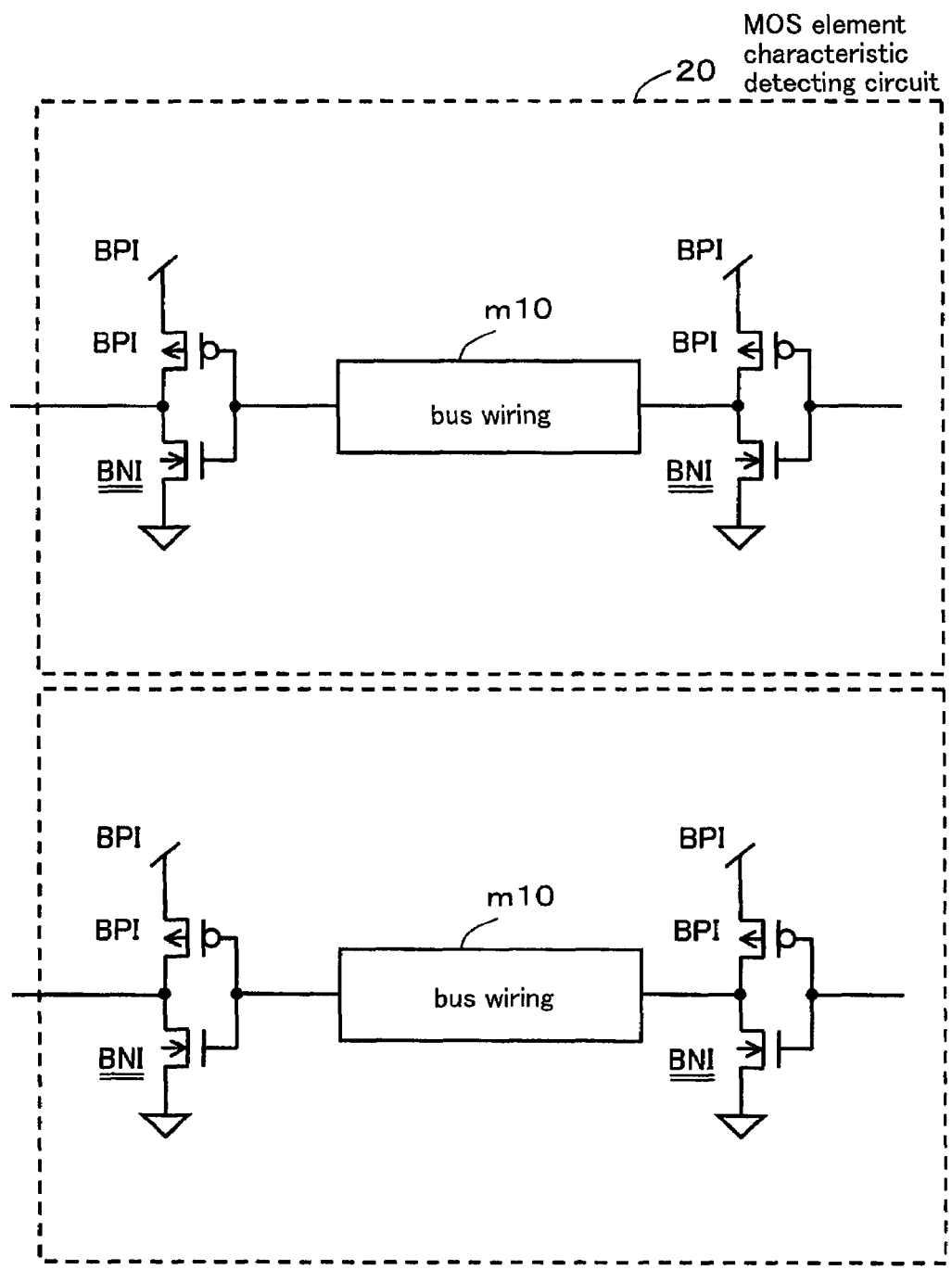

F I G. 1 2
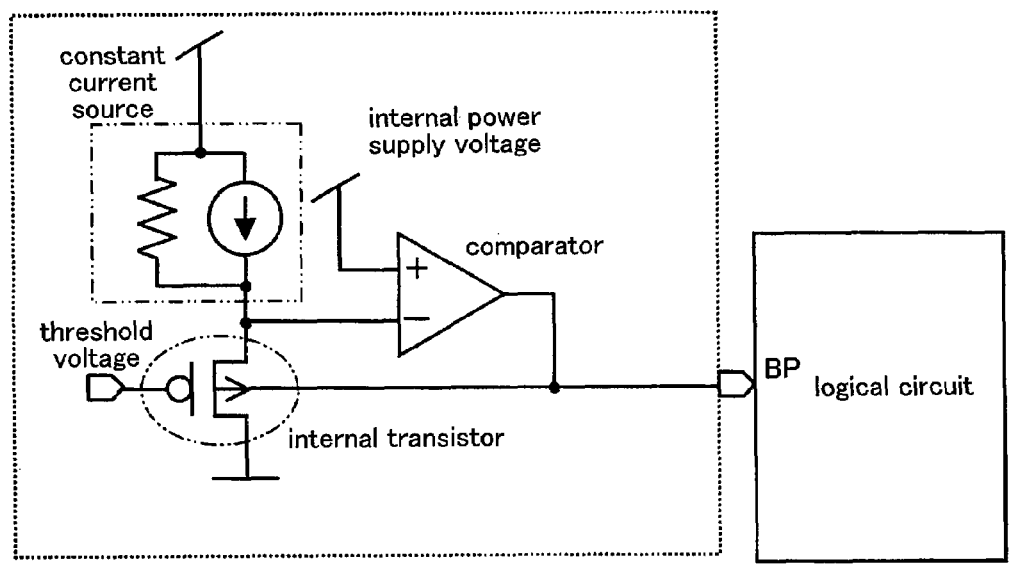

SEMICONDUCTOR INTEGRATED CIRCUIT

RELATED APPLICATIONS

This application is the U.S. National Phase under 35 U.S.C. §371 of International Application No. PCT/JP2006/315104, filed on Jul. 31, 2006, which in turn claims the benefit of Japanese Application No. 2005-224020, filed on Aug. 2, 2005, the disclosures of which Applications are incorporated by reference herein.

FIELD OF THE INVENTION

The present invention relates to a technology for controlling a substrate voltage in a semiconductor integrated circuit.

BACKGROUND OF THE INVENTION

In recent years, it is requested in the field of a semiconductor integrated circuit that the variability of a substrate voltage of the semiconductor integrated circuit resulting from PVT (process, voltage variation, temperature) be reduced based on the control of a substrate voltage of an MOS element for supplying the substrate voltage so as to realize an optimum delay setting and cut down power consumption. In order to realize the request, it is necessary to provide a substrate voltage control circuit for monitoring a characteristic of the MOS element for supplying the substrate voltage and supplying an optimum substrate voltage conformable to an actual delay value to the semiconductor integrated circuit via the MOS element for supplying the substrate voltage. There are two conventional circuits which realized such substrate voltage control.

The first conventional example is a constitution wherein the substrate voltage is supplied to the semiconductor integrated circuit via the MOS element for supplying the substrate voltage so that a saturation current of the MOS element for supplying the substrate voltage can be constant, which is recited in the Non-Patent Document 1. A schematic illustration of the example is shown in FIG. 12.

The second conventional example is a constitution wherein a delay of a replica circuit having the same circuit configuration as that of a circuit to be controlled is monitored, and such a substrate voltage that a delay value thereby obtained can be optimal is supplied to the actual circuit (semiconductor integrated circuit), which is recited in the Non-Patent Document 2.

Non-Patent Document 1: (M. Sumita, S. Sakiyama, M. Kinoshita, Y. Araki, Y. Ikeda, and K. Fukuoka, "Mixed-Body Bias Techniques with Fixed Vt and Ids Generation Circuits" ISSCC Digest of Technical Papers, pp. 158-159, February 2004)

Non-Patent Document 2: (J. Tschanz, J. Kao, S. Narendra, R. Nair, dantoniadis, A. Chandrakasan, and V. De, "Adaptive Body Bias for Reducing Impacts of Die-to-Die and Within-DieParameter Variation on Microprocessor Frequency and Leakage" ISSCC Digest of Technical Papers, pp. 412-413, February 2002.)

DISCLOSURE OF THE INVENTION

Problem to be Solved by the Invention

However, the two conventional constitutions have the following problems. It is not possible to optimally correct the delay value by merely maintaining the saturation current constant as recited in the first conventional example. In such a circuit that a drain capacitance dominantly affects a delay value, in particular, it is difficult to optimally correct the delay value because the delay value of the MOS element for supplying the substrate voltage is not so improved as expected because the drain capacitance is increased though a forward substrate voltage (substrate voltage in such a direction that the MOS element for supplying the substrate voltage is operated at a high speed) is applied in order to correct the saturation current of the MOS element for supplying the substrate voltage. The dependence of the drain capacitance on the substrate voltage
is expressed in the following formula 1).

$$Cd=Cd(0)(1+Vr/Vbt)^{-1/m} \quad (1)$$

Cd: drain capacitance
Vr: applied voltage
Vbt: substrate voltage of MOS element for supplying substrate voltage
m: natural number: 2 or 3

In the second conventional example, it becomes necessary to monitor all of the circuits in order to optimize the whole semiconductor integrated circuit. Further, it is not possible to control any circuit having a the threshold value $V_{t\ therein}$.

A main object of the present invention is to solve the problems of the two conventional examples.

Means for Solving the Problem

In order to solve the foregoing problems, the present invention is characterized in that not only the saturation current of the MOS element for supplying the substrate voltage but also the drain capacitance value thereof are monitored, and the substrate voltage is decided in such a manner that the variation of the drain capacitance value due to PVT is considered in the decision. More specifically, the following constitutions are provided.

A semiconductor integrated circuit according to the present invention comprises a substrate voltage control circuit comprising at least an MOS element for supplying a substrate voltage for controlling the supply of the substrate voltage of the semiconductor integrated circuit;

a drain current setter for adjusting a drain current of the MOS element for supplying the substrate voltage by controlling the substrate voltage of the MOS element for supplying the substrate voltage;

an MOS element characteristic detecting circuit comprising a characteristic detecting element for detecting a characteristic of the MOS element for supplying the substrate voltage; and a drain current corrector for correcting the drain current of the MOS element for supplying the substrate voltage by controlling the substrate voltage of the MOS element for supplying the substrate voltage in accordance with the characteristic of the MOS element for supplying the substrate voltage detected by the MOS element characteristic detecting circuit. Accordingly, a delay correction can be accurately realized in the semiconductor integrated circuit.

In the foregoing constitution, the characteristic detecting element may preferably be a capacitance element. Further, the capacitance element may preferably be a junction capacitance. Accordingly, in the semiconductor integrated circuit wherein, of load capacitances of the circuits, the drain capacitance of the MOS element for supplying the substrate voltage is dominant, the delay can be accurately corrected.

The capacitance element may preferably be a wiring capacitance. Accordingly, in the semiconductor integrated circuit wherein, of the load capacitances of the circuits, the wiring capacitance is dominant, the delay can be accurately corrected.

The wiring capacitance may preferably be a dummy bit line of a memory. Accordingly, in the semiconductor integrated circuit, the delay in the bit line of the memory where the junction capacitance is dominant can be accurately corrected without any additional load to the bit line. Further, a yielding percentage deteriorated due to the delay can be improved, any unnecessary design margin is eliminated so that power consumption can be reduced, a circuit area can be reduced, and a higher processing speed can be achieved.

The characteristic detecting element may preferably be a gate capacitance. Accordingly, in the semiconductor integrated circuit wherein the gate capacitance among the load capacitances of the circuits is dominant or in a state where a gate leakage is dominant, the delay can be accurately corrected.

The characteristic detecting element may preferably be a wiring resistance, in which case the delay can be accurately corrected in the semiconductor integrated circuit wherein the wiring resistance among delay elements of the circuits is dominant.

A wiring capacitance and a resistance may preferably constitute the characteristic detecting element, in which case the delay can be accurately corrected in the semiconductor integrated circuit wherein the wiring delay among the delay elements of the circuits is dominant.

The characteristic detecting element may preferably be provided in a replica block. Accordingly, the delay can be accurately corrected without any addition of an output load element of a functional circuit for realizing a function. Further, the yielding percentage deteriorated due to the delay can be improved, any unnecessary design margin is eliminated so that the power consumption can be reduced, the circuit area can be reduced, and the processing speed can be increased.

The characteristic detecting element may preferably be a functional element for realizing the functions of the semiconductor integrated circuit, in which case information of the actual functional element is used to accurately correct the delay. Further, the yielding percentage deteriorated due to the delay can be improved, any unnecessary design margin is eliminated so that the power consumption can be reduced, the circuit area can be reduced, and the processing speed can be increased.

The functional element may preferably be a bit line of the memory. The delay can be corrected in the bit line of the memory wherein the junction capacitance of the semiconductor integrated circuit is dominant. Further, the yielding percentage deteriorated due to the delay can be improved, any unnecessary design margin is eliminated so that the power consumption can be reduced, the circuit area can be reduced, and the processing speed can be increased.

The functional element may preferably be clock wiring. Accordingly, such a delay as results from a clock skew between the circuits driven by clocks, in particular, the circuits having a long wiring distance therebetween since they are very distance from each other in the semiconductor integrated circuit. Further, the yielding percentage deteriorated due to the delay can be improved, any unnecessary design margin is eliminated so that the power consumption can be reduced, the circuit area can be reduced, and the processing speed can be increased.

The functional element may preferably be a clock buffer. Accordingly, such a delay as results from the clock skew between the circuits driven by clocks, in particular, the circuits having a long wiring distance therebetween since they are very distance from each other in the semiconductor integrated circuit. Further, the yielding percentage deteriorated due to the delay can be improved, any unnecessary design margin is eliminated so that the power consumption can be reduced, the circuit area can be reduced, and the processing speed can be increased.

The functional element may preferably be a capacitance unit of a filter. Accordingly, the delay can be accurately corrected and the AC characteristic can be improved in any circuit having an analog function in the semiconductor integrated circuit, in particular, a circuit configuration which supplies charges. Further, the yielding percentage deteriorated due to the delay can be improved, any unnecessary design margin is eliminated so that the power consumption can be reduced, the circuit area can be reduced, and the processing speed can be increased.

In the foregoing constitution, the functional element may preferably be a VCO circuit (voltage control oscillation circuit). Accordingly, a clock frequency used in the semiconductor integrated circuit can be accurately stabilized.

The functional element may preferably be a resistance of the filter. Accordingly, the delay can be accurately corrected and the AC characteristic can be improved in any circuit having an analog function in the semiconductor integrated circuit, in particular, a circuit where a delay is caused by a resistance. Further, the yielding percentage deteriorated due to the delay can be improved, any unnecessary design margin is eliminated so that the power consumption can be reduced, the circuit area can be reduced, and the processing speed can be increased.

The functional element may preferably be wiring of a bus. Accordingly, the delay between functional blocks of the semiconductor integrated circuit can be accurately corrected. Further, the yielding percentage deteriorated due to the delay can be improved, any unnecessary design margin is eliminated so that the power consumption can be reduced, the circuit area can be reduced, and the processing speed can be increased.

The functional element may preferably be a driver of a bus. Accordingly, the delay between the functional blocks of the semiconductor integrated circuit can be accurately corrected. Further, the yielding percentage deteriorated due to the delay can be improved, any unnecessary design margin is eliminated so that the power consumption can be reduced, the circuit area can be reduced, and the processing speed can be increased.

In the foregoing constitution, the drain current corrector may preferably be constituted as follows.

The drain current corrector preferably comprises a current source, a voltage comparator and a buffer, wherein the current source is connected to a drain of the MOS element for supplying the substrate voltage, a gate of the MOS element for supplying the substrate voltage is set to an arbitrary voltage, a voltage of a signal wire between the MOS element for supplying the substrate voltage and the current source and a reference voltage are inputted to the voltage comparator, a result of the comparison by the voltage comparator is inputted to the buffer, and an output of the buffer is connected to the substrate potential of the MOS element for supplying the substrate voltage. Accordingly, the delay can be accurately corrected in the semiconductor integrated circuit.

The drain current corrector preferably comprises a current source, a current comparator and a buffer, a gate of the MOS element for supplying the substrate voltage is set to an arbitrary voltage, the drain current of the MOS element for supplying the substrate voltage and a reference current are inputted to the voltage comparator, a result of the comparison by the voltage comparator is inputted to the buffer, and an output of the buffer is connected to the substrate potential of the MOS element for supplying the substrate voltage. Accordingly, the delay can be accurately corrected in the semiconductor integrated circuit.

The current comparator preferably comprises a clock of an arbitrary frequency, a current latch circuit operated by the clock, a counter, and a D/A converting circuit, wherein an output of the current latch circuit is inputted to the counter, an output of the counter is connected to the D/A converting circuit, and a result of the comparison by the current comparator is outputted from the D/A converting circuit. Accordingly, the oscillation due to the analog feedback is not generated in the delay correction in the semiconductor integrated circuit. As a result, the delay can be accurately corrected.

The current source preferably adjusts an output current in accordance with the detected characteristic of the MOS element for supplying the substrate voltage. Accordingly, the delay can be accurately corrected.

The reference voltage is preferably adjusted in accordance with the detected characteristic of the MOS element for supplying the substrate voltage and inputted to the voltage comparator. Accordingly, the delay can be accurately corrected.

The output of the buffer is preferably adjusted in accordance with the detected characteristic of the MOS element for supplying the substrate voltage and connected to the substrate potential of the MOS element for supplying the substrate voltage. Accordingly, the delay can be accurately corrected.

A gate voltage of the MOS element for supplying the substrate voltage is preferably a voltage other than a power supply voltage. Accordingly, it can be avoided to undermine noise margins of a dynamic circuit and a domino circuit resulting from a threshold value of the semiconductor integrated circuit in order to realize the delay correction with a high accuracy.

The output current of the current supply is preferably adjusted in accordance with the power supply voltage. Accordingly, noise margins in which the power supply voltage is reflected can be realized without any adverse influence on the noise margins of the dynamic circuit and the domino circuit resulting from the threshold value of the semiconductor integrated circuit. As a result, the delay can be accurately corrected.

The reference voltage is preferably adjusted in accordance with the power supply voltage. Accordingly, the noise margin values in which the power supply voltage is reflected can be realized without any adverse influence on the noise margins of the dynamic circuit and the domino circuit resulting from the threshold value of the semiconductor integrated circuit. As a result, the delay can be accurately corrected.

The output of the buffer is preferably adjusted in accordance with the power supply voltage. Accordingly, the noise margins in which the power supply voltage is reflected can be realized without any adverse influence on the noise margins of the dynamic circuit and the domino circuit resulting from the threshold value of the semiconductor integrated circuit. As a result, the delay can be accurately corrected.

The current comparator preferably transmits an output value of the current latch circuit to the counter when an output value of a first flip-flop for retaining the output value of the current latch circuit by an output of a first delay element to which the clock signal is inputted and an output value of a second flip-flop for retaining the output value of the current latch circuit by an output of a second delay element to which the clock signal is inputted are equal to each other. Accordingly, the output value of the current comparator can be outputted upon the confirmation that the compared currents are not equal to each other and therefore the output value of the current comparator is not unstable.

The current comparator preferably transmits an output value of another signal to the counter when the output value of the first flip-flop for retaining the output value of the current latch circuit by the output of the first delay element to which the clock signal is inputted and the output value of the second flip-flop for retaining the output value of the current latch circuit by the output of the second delay element to which the clock signal is inputted are not equal to each other. Accordingly, the substrate voltage control circuit system can be stably converged so long as the compared currents are substantially equal to each other though the output value of the current comparator becomes unstable.

The current source preferably adjusts the output current in accordance with a temperature of the semiconductor integrated circuit during a period when the MOS element for supplying the substrate voltage is halted. Accordingly, the voltage level of the MOS element for supplying the substrate voltage and the voltage level of the signal wire of the current source can stay within an appropriate input voltage range based on a result of the comparison of the comparator in the latter stage. As a result, the substrate voltage control circuit system can be stably converged.

The number of the MOS elements for supplying the substrate voltage connected to the current source is preferably variable depending on the temperature of the semiconductor integrated circuit during the period when the MOS elements for supplying the substrate voltage are halted. Accordingly, the voltage level of the MOS element for supplying the substrate voltage and the voltage level of the signal wire of the current source can stay within the appropriate input voltage range, as a result of which the substrate voltage control circuit system can be stably converged.

The drain current corrector preferably interrupts the signal wire between the MOS element for supplying the substrate voltage and the current source inputted to the voltage comparator, and connects another signal wire having a fixed voltage value to the voltage comparator during the period when the MOS element for supplying the substrate voltage is halted. Accordingly, a reverse bias at a maximum level can be applied to the MOS source by the substrate voltage of the MOS of the semiconductor integrated circuit, which reduces the leakage current of the semiconductor integrated circuit.

The drain current corrector preferably connects the signal wire between the MOS element for supplying the substrate voltage and the current source to the second comparator during the period when the MOS element for supplying the substrate voltage is halted. Accordingly, such a substrate bias as minimizes the leakage current of the MOS drain of the semiconductor integrated circuit can be applied by the substrate voltage of the MOS of the semiconductor integrated circuit. As a result, the leakage current of the semiconductor integrated circuit can be reduced.

A data retaining circuit for fetching the voltage value of the signal wire between the MOS element for supplying the substrate voltage and the current source and retaining the fetched voltage value as a previous value is preferably further provided, wherein the second comparator fetches the voltage value of the signal wire between the MOS element for supplying the substrate voltage and the current source as an immediate value, and then, fetches the previous value retained in the data retaining circuit and compares the fetched immediate value to the previous value to thereby extract and output the applied voltage data. Accordingly, such a substrate bias as minimizes the leakage current of the MOS drain of the semiconductor integrated circuit can be applied to the MOS. As a result, the leakage current of the semiconductor integrated circuit can be reduced.

A limiter for limiting the output voltage value of the buffer is preferably provided, wherein the drain current corrector further comprises a counter and a D/A converter, the output of the second comparator is inputted to the counter, an output of the counter is inputted to the D/A converting circuit, and an output of the D/A converting circuit is inputted to a reference voltage of the limiter. Accordingly, such a substrate bias as minimizes the leakage current of the MOS drain of the semiconductor integrated circuit can be applied to the MOS. As a result, the leakage current of the semiconductor integrated circuit can be reduced. Further, a substrate voltage generating buffer, while the semiconductor integrated circuit is operating, can also be used as the limiter.

The drain current corrector preferably halts the second comparator and the counter in accordance with the temperature of the semiconductor integrated circuit during the period when the MOS element for supplying the substrate voltage is halted. Accordingly, a self current of the substrate voltage control circuit can be reduced.

The drain current corrector preferably halts the second comparator and the counter in accordance with the power supply voltage value of the semiconductor integrated circuit during the period when the MOS element for supplying the substrate voltage is halted. Accordingly, the self current of the substrate voltage control circuit can be reduced.

The drain current corrector preferably outputs an LSB value as the output voltage of the D/A converter in the case where the temperature of the semiconductor integrated circuit is at least an arbitrary temperature during the period when the MOS element for supplying the substrate voltage is halted. Accordingly, such a substrate bias as minimizes the leakage current of the MOS drain of the semiconductor integrated circuit can be applied to the MOS. As a result, the leakage current of the semiconductor integrated circuit can be reduced.

The drain current corrector preferably outputs an LSB value as the output voltage of the D/A converter in the case where the power supply voltage value of the semiconductor integrated circuit is at most an arbitrary voltage during the period when the MOS element for supplying the substrate voltage is halted. Accordingly, such a substrate bias as minimizes the leakage current of the MOS drain of the semiconductor integrated circuit can be applied to the MOS. As a result, the leakage current of the semiconductor integrated circuit can be reduced.

The current source preferably adjusts the output current in accordance with the temperature of the semiconductor integrated circuit during the period when the MOS element for supplying the substrate voltage is halted. Accordingly, the voltage level of the MOS element for supplying the substrate voltage and the voltage level of the signal wire of the current source can stay within the appropriate input voltage range. As a result, the substrate voltage control circuit system can be stably converged.

The number of the MOS elements for supplying the substrate voltage connected to the current source is preferably variable depending on the temperature of the semiconductor integrated circuit during the period when the MOS elements for supplying the substrate voltage are halted. Accordingly, the voltage level of the MOS element for supplying the substrate voltage and the voltage level of the signal wire of the current source can stay within the appropriate input voltage range, as a result of which the substrate voltage control circuit system can be stably converged.

The MOS element characteristic detecting circuit preferably detects the characteristic of the MOS element for supplying the substrate voltage based on information obtained when charges are supplied to the characteristic detecting element during an arbitrary period. Accordingly, the delay can be accurately corrected in a discrete manner, and a factor of a noise generated during the correction in the MOS element characteristic detecting circuit can be thereby eliminated. As a result, the operation can be stabilized.

The MOS element characteristic detecting circuit preferably comprises a comparator for comparing the output of the characteristic detecting element to a reference value, wherein the MOS element characteristic detecting circuit detects the characteristic of the MOS element for supplying the substrate voltage based on a result of the comparison by the comparator. The comparator preferably compares the voltage in the state where charges are supplied to the characteristic detecting element during the arbitrary period to the reference voltage. Accordingly, the delay can be discretely corrected with a high accuracy, and the factor of the noise generated during the correction in the MOS element characteristic detecting circuit can be thereby eliminated. As a result, the operation can be stabilized.

The MOS element characteristic detecting circuit preferably further comprises a resistance element serially connected to the characteristic detecting element, wherein the comparator secures both ends of the resistance element to arbitrarily voltages different to each other, and compares the voltage at a section where the characteristic detecting element and the resistance element are connected to each other to the reference voltage. Accordingly, such a simplified circuit configuration allows the delay to be accurately corrected, while making it possible to reduce the circuit area.

The comparator preferably supplies charges to one end of the characteristic detecting element, and compares a time period necessary for the other end to reach an arbitrary voltage to a reference time period. Accordingly, the present invention can be realized by a simplified digital circuit, which makes it unnecessary to use a complicated analog circuit. As a result, a designing process can be facilitated.

The comparator preferably secures both ends of the characteristic detecting element to arbitrarily voltages different to each other, and compares the current value at one of the ends of the characteristic detecting element to the reference voltage. As a result, the delay can be accurately corrected at a high speed.

The comparator is preferably a latch circuit. Accordingly, the delay can be accurately corrected.

An operator provided in the semiconductor integrated circuit is preferably also used as the comparator. Accordingly, the present invention can be realized by a simplified digital circuit, which makes it unnecessary to use a complicated analog circuit. As a result, the designing process can be facilitated.

Software preferably constitutes the comparator, in which case the overhead of the correcting circuit is not generated in the semiconductor integrated circuit. As a result, the delay can be accurately corrected.

The semiconductor integrated circuit is preferably divided into blocks comprising arbitrary functions. As a result, the delay can be accurately corrected by each of the functional blocks of the semiconductor integrated circuit.

The semiconductor integrated circuit preferably comprises a SOC (System on a Chip) function. Accordingly, the delay correction of the entire semiconductor integrated circuit can be controlled, and the delay can be thereby accurately corrected in a well-balanced manner.

The semiconductor integrated circuit preferably comprises a processor function. As a result, the delay can be accurately corrected, while the performance of each processor in the semiconductor integrated circuit is maintained at the same time.

The drain current corrector preferably starts the correction after the drain current setter completes the setting of the drain current of the MOS element for supplying the substrate voltage in an arbitrary state of the MOS element for supplying the substrate voltage. As a result, the substrate voltage can be sequentially corrected, and the delay can be accurately corrected in a more stable manner.

The drain current corrector preferably further comprises a memory device in which correction information is stored, wherein the drain current corrector executes the correction in a shipping inspection of the semiconductor integrated circuit and stores information of the correction in the memory device. As a result, any section undergoing the deterioration of the yielding percentage due to the delay can be restored, which improves the yielding percentage.

The drain current corrector preferably executes the correction when an operation frequency of the semiconductor integrated circuit is at least an arbitrary value. Accordingly, the delay can be selectively corrected with a high accuracy whenever the delay correction of the semiconductor integrated circuit is necessary, while the drain current corrector is halted when the delay correction is unnecessary (the delay is allowable). As a result, the power consumption can be reduced.

The drain current corrector preferably executes the correction when the operation frequency of the semiconductor integrated circuit is at most an arbitrary value. As a result, the delay can be accurately corrected in a circuit part where the reduction of the power consumption through the control of the power supply is demanded.

The drain current corrector executes the correction once every arbitrary period after the semiconductor integrated circuit is shipped. Accordingly, the delay resulting from the deterioration over time in the semiconductor integrated circuit can be accurately corrected. Further, the drain current corrector is not operated whenever unnecessary so that the power consumption can be reduced.

The drain current corrector preferably executes the correction when the temperature of the semiconductor integrated circuit is at least an arbitrary value. Accordingly, the delay in the circuit having a positive temperature characteristic in the semiconductor integrated circuit can be accurately corrected. Further, the power consumption can be reduced because the drain current corrector can be halted when the temperature of the semiconductor integrated circuit is below the arbitrary value.

The drain current corrector preferably executes the correction when the temperature of the semiconductor integrated circuit is at most an arbitrary value. Accordingly, the delay can be accurately corrected in the circuit having a negative temperature characteristic in the semiconductor integrated circuit can be accurately corrected. Further, the power consumption can be reduced because the drain current corrector can be halted when the temperature of the semiconductor integrated circuit exceeds the arbitrary value.

The drain current corrector preferably executes the correction when the voltage of the semiconductor integrated circuit is at least an arbitrary value. Accordingly, the delay correction can be accurately performed when the semiconductor integrated circuit is operated at a higher speed. Further, the power consumption can be reduced because the drain current corrector can be halted when the voltage of the semiconductor integrated circuit is below the arbitrary value.

The drain current corrector preferably executes the correction when the voltage of the semiconductor integrated circuit is at most an arbitrary value. Accordingly, the delay correction can be accurately performed when the semiconductor integrated circuit is operated at a lower speed. Further, the power consumption can be reduced because the drain current corrector can be halted when the voltage of the semiconductor integrated circuit exceeds the arbitrary value.

The drain current corrector preferably executes the correction when an activation rate of the semiconductor integrated circuit is at least an arbitrary value. Accordingly, the delay is not increased by the voltage drop of the semiconductor integrated circuit, and the delay can be accurately corrected.

The drain current corrector preferably executes the correction when the functional block (logical circuit) of the semiconductor integrated circuit starts to operate. Accordingly, the power consumption can be reduced when the functional block of the semiconductor integrated circuit is halted, and the delay can be corrected in the functional block only when necessary.

The drain current corrector preferably turns off its own power supply when its correction process is halted. Accordingly, the leakage current of the semiconductor integrated circuit can be reduced, which improves the accuracy of the delay correction.

The drain current corrector preferably retains the value detected by the MOS element characteristic detecting circuit when the correction is halted. Accordingly, the delay correction speedily starts when activated, which improves the accuracy of the delay correction.

The semiconductor integrated circuit preferably further comprises:

a PAD for external connection; and a signal wire for transmitting the value detected by the MOS element characteristic detecting circuit to the drain current corrector, wherein the signal wire is connected to the PAD. As a result, the shipping inspection of the drain current corrector can be facilitated.

The drain current corrector preferably comprises a self-test function. Accordingly, the drain current corrector can be speedily tested when the semiconductor integrated circuit undergoes the shipping inspection or is activated.

The semiconductor integrated circuit preferably further comprises a memory block, wherein the drain current corrector is provided in the memory block. Accordingly, such a delay correction as is most suitable for the memory block in the semiconductor integrated circuit can be accurately performed.

Commonality may be preferably provided between the power supply voltage of the drain current setter and the power supply voltage of the MOS element characteristic detecting circuit. Accordingly, a wiring resource for the voltage PAD and other power supplies in the semiconductor integrated circuit can be reduced. As a result, the circuit area can be reduced.

EFFECT OF THE INVENTION

As described, according to the present invention, not only the saturation current but also the drain capacitance value of the MOS element for supplying the substrate voltage can be monitored, and the substrate voltage is decided in such a manner that the variation of the drain capacitance value due to PVT is considered in the decision. As a result, the delay correction can be realized with a high accuracy in the semiconductor integrated circuit.

BRIEF DESCRIPTION OF THE DRAWINGS

FIG. 2A is a circuit diagram of a circuit for detecting a gate capacitance characteristic according to the preferred embodiment.

FIG. 2B is a waveform chart of the circuit shown in FIG. 2A.

FIG. 5 is a circuit diagram of a circuit for detecting a wiring characteristic and a capacitance characteristic according to the preferred embodiment.

FIG. 7A, is a circuit diagram of a circuit for detecting a characteristic of a functional element of the semiconductor integrated circuit according to the preferred embodiment.

FIG. 7B shows an effective transistor-well layout in the semiconductor integrated circuit according to the preferred embodiment.

FIG. 10 is a circuit diagram of a circuit for detecting a characteristic of a bus-based element in the semiconductor integrated circuit according to the preferred embodiment.

FIG. 12 is a block diagram illustrating a constitution of a substrate voltage control circuit according to a conventional technology.

Figure 1A:
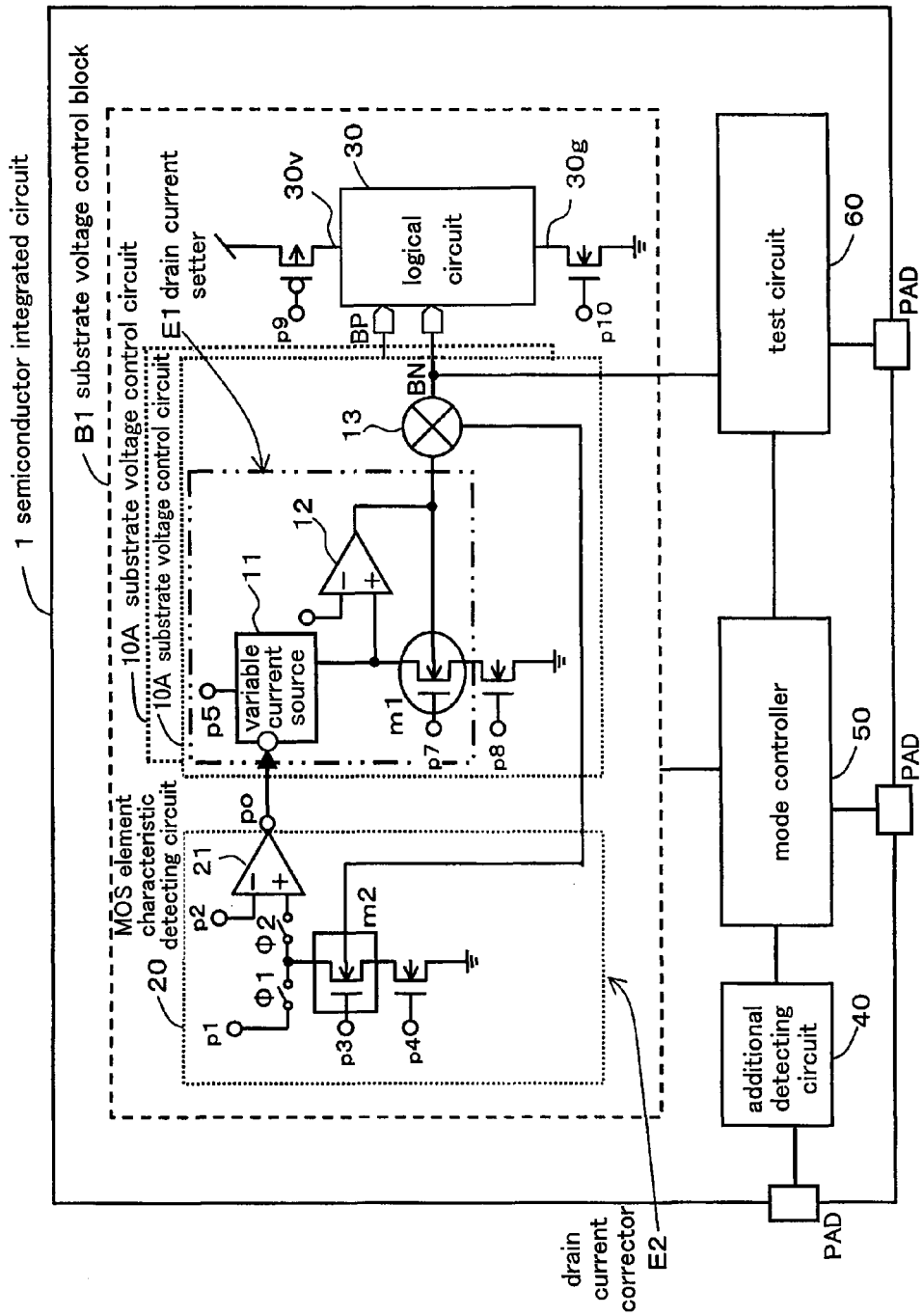
FIG. 1A is a block diagram illustrating a constitution of a semiconductor integrated circuit according to a preferred embodiment of the present invention.

DESCRIPTION OF THE REFERENCE SYMBOLS 1 semiconductor integrated circuit
10, 10a substrate voltage control circuit
11 variable current source
11a reference current source
12 comparator
13 mixer (buffer)
14 current value comparator
15 counter
16 D/A converting circuit
17 buffer
20 MOS element characteristic detecting circuit
21 comparator
22 resistance material
30 logical circuit
40 additional detecting circuit
50 mode controller
60 test circuit
B1 substrate voltage control block
E1 drain current value setter
E2 drain current value corrector
m1 MOS element for supplying substrate voltage
m2-m10 characteristic detecting element

PREFERRED EMBODIMENT OF THE PRESENT INVENTION

Hereinafter, a preferred embodiment of the present invention is described referring to the drawings. FIG. 1A is a block diagram illustrating an entire constitution of a semiconductor integrated circuit according to the preferred embodiment.

A substrate voltage control block B1 comprises a logical circuit 30 to be controlled, a substrate voltage control circuit 10, and an MOS element characteristic detecting circuit 20. The substrate voltage control circuit 10 sets a substrate voltage BN which is supplied to an NMOS substrate of the logical circuit 30 to an arbitrary value. A substrate voltage control circuit 10A for controlling a substrate voltage BP which is supplied to a PMOS substrate of the logical circuit 30, which functions in the same manner as the substrate voltage control circuit 10, is omitted in this example of the present preferred embodiment. The substrate voltage control circuit 10 comprises at least an MOS element m1 for supplying the substrate voltage to be monitored and a variable current source 11 for correcting a drain current of the MOS element m1 for supplying the substrate voltage. The MOS element characteristic detecting circuit 20 detects a characteristic of the MOS element m1 for supplying the substrate voltage.

The substrate voltage control circuit 10 controls the substrate voltage of the MOS element m1 for supplying the substrate voltage to thereby set the substrate voltage BN to be supplied to the logical circuit 30 to an arbitrary value. The MOS element characteristic detecting circuit 20 comprises a characteristic detecting element m2 for detecting the characteristic of the MOS element m1 for supplying the substrate voltage. The MOS element characteristic detecting circuit 20 indirectly detects the characteristic of the MOS element m1 for supplying the substrate voltage through the detection of a characteristic of the characteristic detecting element m2. The variable current source 11 corrects the current (drain current) to be supplied to the drain of the MOS element m1 for supplying the substrate voltage based on the characteristic of the characteristic detecting element m2 detected by the MOS element characteristic detecting circuit 20. The characteristic of the MOS element m1 for supplying the substrate voltage naturally includes a current characteristic which is decided when the semiconductor integrated circuit is manufactured, and also includes such characteristics as a resistance and a capacitance of a metallic wiring layer connected to the MOS element m1 for supplying the substrate voltage. 30v denotes a power supply source of the logical circuit, and 30g denotes a ground wire of the logical circuit.

The rest of the components are described. The semiconductor integrated circuit comprises an additional detecting circuit 40, a mode controller 50 and a test circuit 60. The additional detecting circuit 40 detects a power supply voltage, a temperature, an activation rate and an operation frequency of the logical circuit, and the like. The mode controller 50 transmits various pieces of information to the substrate voltage control block B1 based on the information of the additional detecting circuit 40, information from outside of the semiconductor integrated circuit 1 (for example, processing performance load information, battery charging rate and the like of the semiconductor integrated circuit 1) and information of the test circuit 60 for testing the functions of the substrate voltage control block B1. The test circuit 60 is connected to a PAD for external connection of the semiconductor integrated circuit 1, and outputs a result of the tests performed on the functions of the substrate voltage control block B1 in shipping inspection to outside of the semiconductor integrated circuit 1.

As an example of the MOS element characteristic detecting circuit 20 for detecting the characteristic of the characteristic detecting element m2 is shown a circuit for detecting a junction capacitance value of the characteristic detecting element m2. The MOS element characteristic detecting circuit 20 comprises ports p1, p2, p3 and p4, and these ports are connected to the mode controller 50. In the case where, for example, the substrate voltage control circuit 10 fixes an MOS source/drain current Ids decided by each power supply voltage of the logical circuit 30 to a constant level, a reference voltage of a comparator 20 is connected to the power supply wire 30v of the logical circuit, a source voltage of the MOS element m1 for supplying the substrate voltage is set to a potential equal to that of the power supply wire 30g of the logical circuit, and the variable current source 11 is set to a current decided by the power supply voltage. For example, when the source/drain voltage of the MOS element m1 for supplying the substrate voltage is set to 1 V, the source/drain current Ids is set to 600 µA. When the source/drain voltage is set to 0.8 v, the source/drain current Ids is set to 400 µA. A port p7 is connected to the power supply wire 30v of the logical circuit. In the case where an MOS threshold value, which is set to an arbitrarily value by the power supply voltage and the activation rate of the logical circuit 30, is set to be constant, a reference voltage of a comparator 12 is connected to the power supply wire 30v of the logical circuit, and the output current of the variable power supply 11 is set to the current value decided by the power supply voltage. The port p7 is connected to the MOS threshold value which is set by the power supply voltage and the activation rate of the logical circuit 30. For example, when the power supply voltage is 1 V and the activation ratio is 0.1, the threshold value is 400 mV. The before-mentioned two examples are the specific examples where each port of the substrate voltage control circuit 10 is set in accordance with the power supply control of the logical circuit 30. These are very effective setting examples in order to set the saturation current and the threshold value to be constant so that any influence from variations due to a manufacturing process, power supply, temperature and the like can be avoided and also reduce the power consumption of the logical circuit 30.

The MOS element characteristic detecting circuit 20 comprises a switched capacitor circuit, and waveforms with timing signals φ1 and φ2 are shown in the waveform chart of FIG. 2B. When the timing signal φ1 is active, the charges are supplied to the junction capacitance of the characteristic detecting element m2. When the timing signal φ1 is non-active and the timing signal φ2 is activated, the charges supplied to the junction capacitance are compared to a reference voltage of a port p2 of a comparator 21.

The substrate voltage control circuit 10 comprises ports p5, p6, p7 and p8, and these ports are connected to the mode controller 50. The substrate voltage control circuit 10 comprises a variable current source 11 variably controlled by output values of the port p5 and the MOS characteristic detecting circuit 20, a comparator 12 for treating a voltage inputted from the port p6 as a reference voltage, and a mixer (buffer) 13. An output of the comparator 12 is connected to the substrate potential of the MOS element m1 for supplying the substrate voltage and the mixer 13. An output of the mixer 13 is divided into the output with respect to the characteristic detecting element m2 and the substrate voltage BN. The substrate voltage BN is connected to the substrate potential of the MOS element m1 for supplying the substrate voltage of the logical circuit 30. The power supply source 30v and the ground wire 30g of the logical circuit 30 are connected to a power supply and a ground supplied to the semiconductor integrated circuit 1 via the MOS in which a port p9 is connected to the gate or the MOS in which a port p10 is connected to the gate, or alternatively the power supply source 30v and the ground wire 30g of the logical circuit 30 are directly connected to the power supply and the ground supplied to the semiconductor integrated circuit 1. In the former constitution, the source of the MOS element m1 for supplying the substrate voltage is connected to the drain of the MOS in which the port p8 is connected to the gate, and the source of the MOS in which the port p8 is connected to the gate is connected to the ground supplied to the semiconductor integrated circuit 1. In the case where the power supply of the logical circuit 30 is turned off, the former constitution enables control to be exercised within the semiconductor integrated circuit 1 and is effective in the case where a speedy responsiveness is necessary when the power supply is repeatedly turned on and off.

Figure 1B:
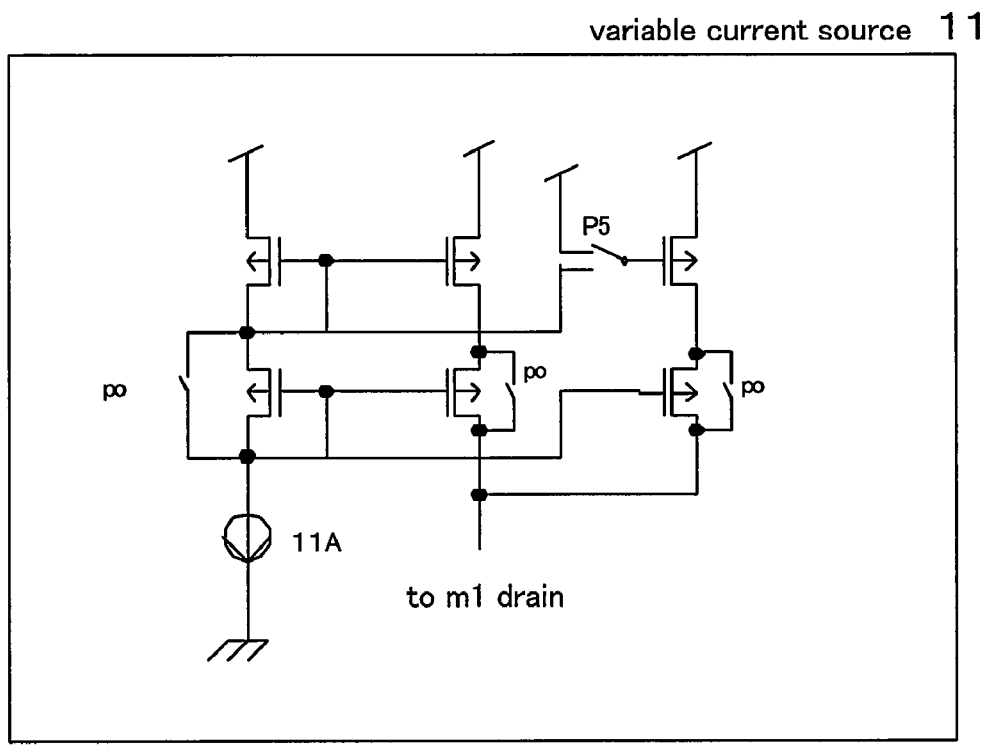
FIG. 1B shows a constitution of a variable current source in the semiconductor integrated circuit according to the preferred embodiment.

An operation of the semiconductor integrated circuit 1 according to the present preferred embodiment is described referring to FIG. 1A. In a test performed when the semiconductor integrated circuit 1 is shipped, the mode controller 50 detects information from the additional detecting circuit 40 (power supply voltage, temperature, activation rate and operation frequency of the logical circuit, and the like) and information from outside to thereby check whether or not control signals of the ports p1-p8 are normally operated. The mode controller 50 transmits a result of the test to the PAD via the test circuit 60. Upon the confirmation that these control signals are normally operated, the mode controller 50 checks in the test circuit 60 or outside of the PAD whether or not the current of the variable current source 11 shows a set current value. When it is judged that the current of the variable current source 11 is different to the set current value in a result of the test, the mode controller 50 supplies the control signal to the port p5 so that the variable current source 11 has the set current value to thereby trim the output current of the variable current source 11. Details of the variable current source 11 are shown in FIG. 1B. The constitution shown in FIG. 1B comprises a current source 11A, a reconfigurable current mirror circuit and the like. The degree of parallelization and the number of serial stages of resistance elements constituting the current source 11A and PMOS elements constituting the current mirror circuit are variable depending on a non-volatile memory and fuse of the mode controller 50. In FIG. 1B, the degree of parallelization of the current mirror circuit can be switched to being variable by p5, and the number of serial stages is switched to be variable by P0, while the number of serial stages can be switched to being variable by P0. Thereafter, the mode controller 50 sets the control signals of the ports p4 and p8 to the "L" level to thereby check again whether or not the leakage current is appropriate.

After that, the mode controller 50 sets the port p8 to the "L" level, and controls the input signal of the port p5 so that the value of the variable current source 11 is not changed by the output of the comparator 21 of the MOS element characteristic detecting circuit 20. When the feedback operation of the substrate voltage control circuit 10 is stabilized and the voltage of the substrate voltage BN is thereby stabilized in the foregoing state, the mode controller 50 applies a current in proportion to the variable current source 11 to the port p1 in the MOS element characteristic detecting circuit 20 and applies a desired voltage to the ports p2-p4 to thereby start such an operation that the timing signals φ1 and φ2 maintain a predetermined timing. When the foregoing adjustments are thus continued, the variable current source 11 is changed until the junction capacitance of the characteristic detecting element m2 is charged within a predetermined time length, and the substrate voltage BN is stabilized again.

A drain current setter E1 comprises the variable current source 11, comparator 12 and MOS element m1 for supplying the substrate voltage. The MOS element m1 for supplying the substrate voltage controls the substrate voltage. The MOS element characteristic detecting element 20 constitutes a drain current corrector E2, which controls the variable current source 11.

Figure 1C:
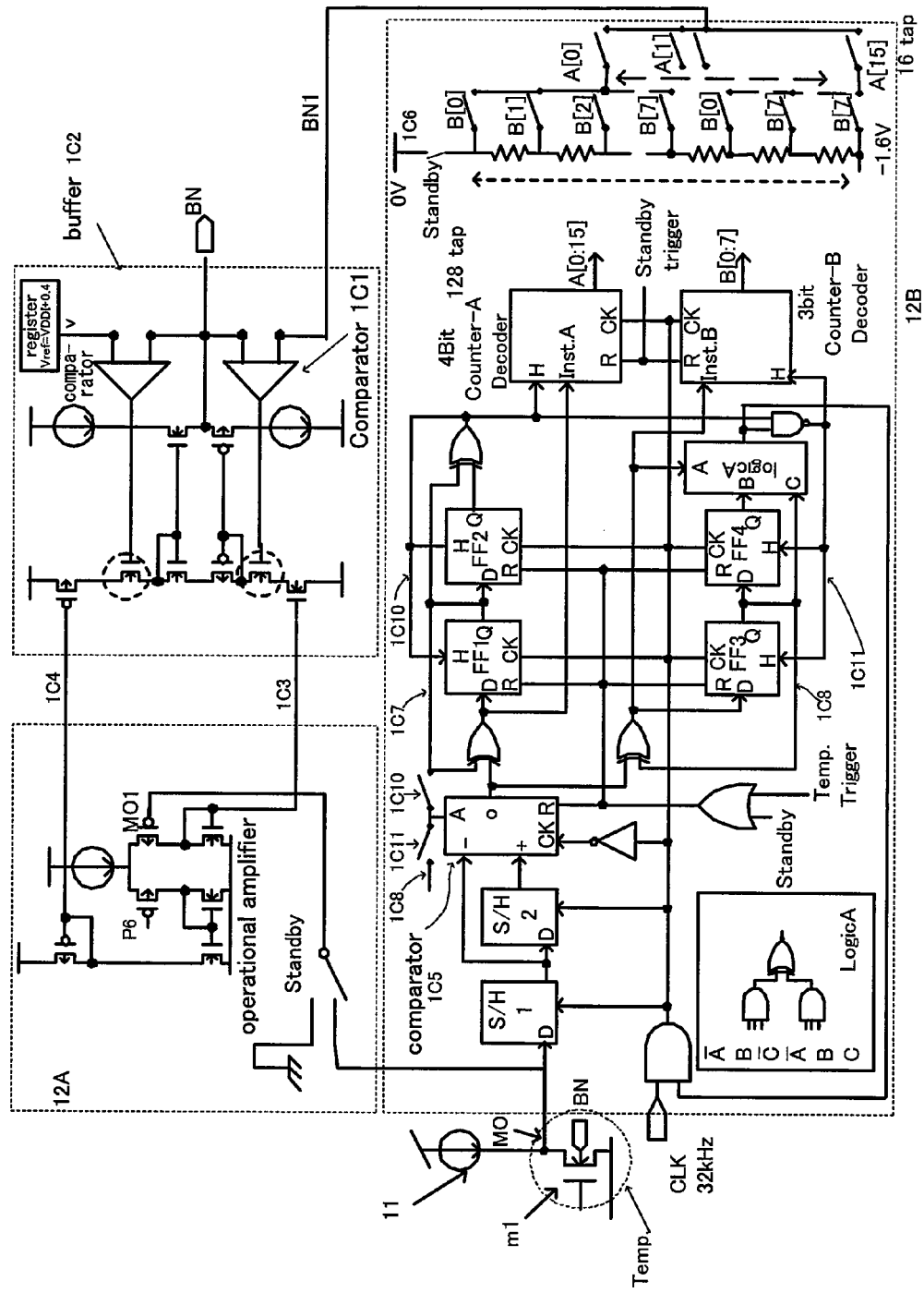
FIG. 1C shows a first constitution of a comparator in the semiconductor integrated circuit according to the preferred embodiment.

Details of the comparator 12 are shown in FIG. 1C. A signal wire MO to which the variable current source 11 and the characteristic detecting element m2 are connected is inputted to comparators 12A and 12B, and outputs of the comparators 12A and 12B are inputted to a buffer 1C2. A voltage BN1 from the comparator 12B is applied to a reference voltage of a comparator 1C1, which is a limiter for limiting an output voltage value of the buffer 1C2 of the comparator 12A. In accordance with the operation and halt of the logical circuit 30, the comparators 12A and 12B are controlled by a standby trigger signal. When the logical circuit 30 is operating, a signal of the signal wire MO is transmitted to MO1 of the comparator 12A, and the substrate voltage from the comparator 12A is selected and applied to the NMOS substrate of the logical circuit 30 via the substrate signal wire BN. When the logical circuit 30 is not operating (power supply is ON, however, the operation is halted), a ground potential is inputted to the MO1 of the comparing circuit 12A, and output signals 1C3 and 1C4 of the comparing circuit 12A get close to the VDD. The voltage value of the substrate signal wire BN of the buffer 1C2 becomes equal to the reference voltage value BN1 of the comparator 1C1. Accordingly, irrespective of if the logical circuit 30 is operating or not operating, the output of the substrate signal wire BN is outputted from the same buffer. As a result, an area and power consumption of the buffer can be reduced.

During the period when the logical circuit 30 is not operating, the gate voltage of the characteristic detecting element m2 is set to have a potential equal to that of the source voltage of the characteristic detecting element m2. Further, the degree of parallelization of the MOS of the characteristic detecting element m2 is changed in accordance with a temperature range. When the temperature is low, the degree of parallelization is increased in order to control the MO voltage level within a certain range. When the MO voltage level is controlled within a certain range, the comparison operation of output values of sample hold circuits S/H1 and S/H2 can be stably performed by a comparator 1C5. In the case where the degree of parallelization of the characteristic detecting element m1 cannot be made variable, the current amount of the current source 11 may be changed depending on the temperature range, in which case the current value of the current source 11 is reduced more as the temperature is lower.

In the comparator 12B, FF1, FF2, FF3 and FF4 are flip-flops, each of which comprises a D port, CK port, R port and an H port. The D port is a data input terminal, the CK port is a clock input terminal, the R port is a reset input terminal, and the H port is a hold instruction terminal for retaining data irrespective of a voltage level of the CK port. InstA and InstB comprise an incrementable and decrementable counter and a decoding circuit for decoding a value of the counter. Input ports of the InstA and InstB comprise an H port, an Inst port, an R port, a CK port, an instA output port A [0:15], and an instB output port B [0:7]. The H, R and CK ports are defined in the same manner as the ports of the flip-flops. The inst input decides if the counter is incremented or decremented depending on its value. The instA output port A [0:15] and instB output port B [0:7] control a selection switch for deciding which of nodes of a resistance tree 1C6 provided between voltages 0-1.6 V is selected.

The comparator 12B is powered off or halted and is set to a substrate bias lower limit value during halts, when the temperature is at least a certain temperature, or when the power supply voltage is at most the power supply voltage, because the drain leakage of the characteristic detecting element m2 can be minimized when the substrate bias voltage value BN is set to the lower limit value under the circumstances where the temperature is at least a certain temperature and the power supply voltage is at most the power supply voltage, and any excessive self current leakage component of the comparator 12B itself can be thereby eliminated. During the halt of the logical circuit 30, the voltage value of the substrate signal wire BN is affected by the BTBT (band to band tunneling leakage current) current under the circumstances where the temperature and the power supply voltage are respectively in other ranges. The voltage value of the substrate signal wire BN is set to such a value as minimizes the drain leakage of the characteristic detecting element m1 within the ranges of upper-limit and lower-limit voltage values of the resistance tree 1C6.

Figure 1D:
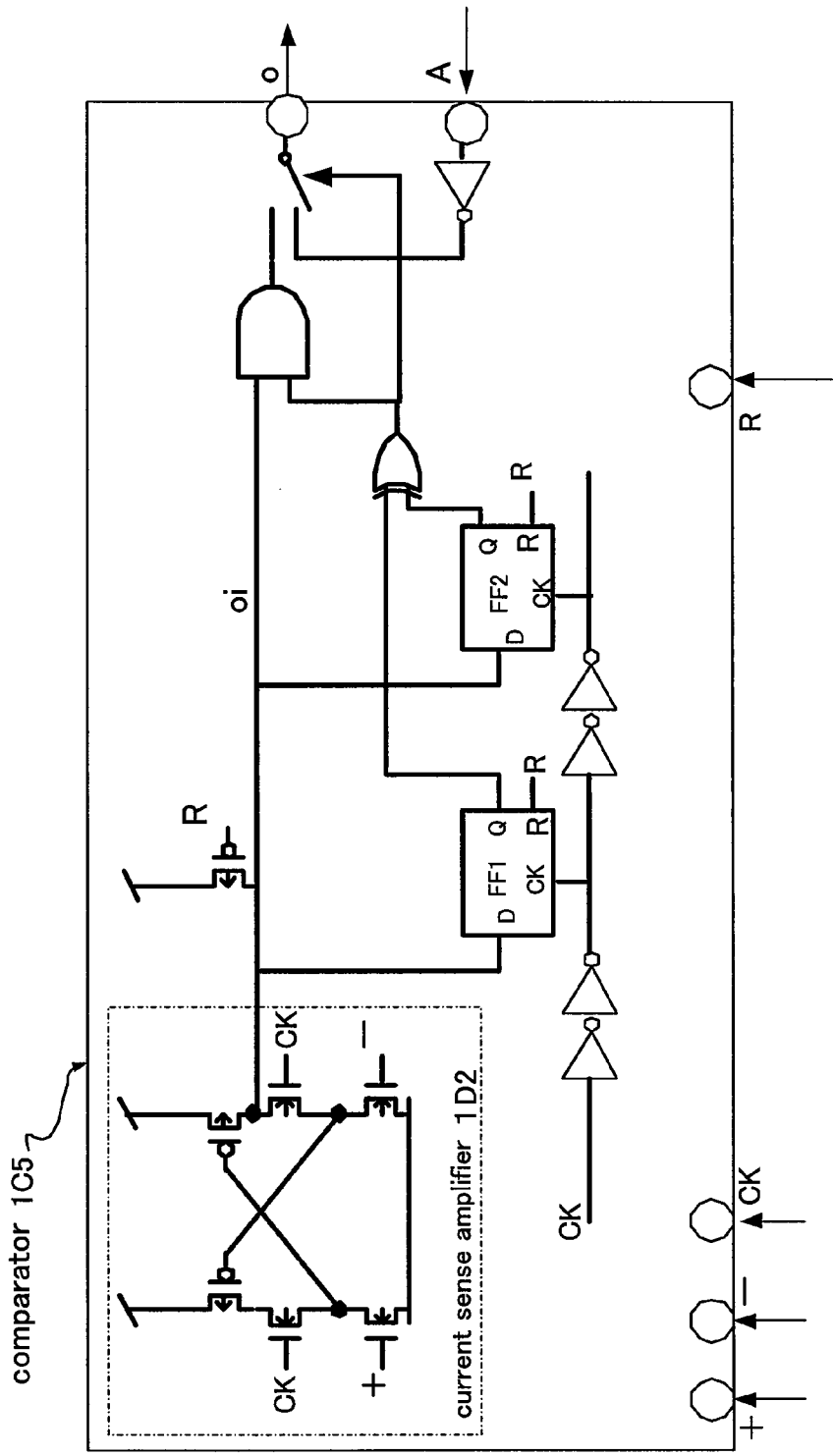
FIG. 1D shows a second constitution of a comparator in the semiconductor integrated circuit according to the preferred embodiment.

Details of the comparator 1C5 are shown in FIG. 1D. The comparator 1C5 comprises a current sense amplifier 1D2, flip-flops FF1 and FF2, and a logic gate. In the current sense amplifier 1D2, the output results of the sample hold circuits SH1 and SH2 are compared to each other, and a result of the comparison is finally outputted to an output terminal o via an output oi.

In the case where a voltage difference value between the sample hold circuits SH1 and SH2 is small, a tilt of an output waveform of the output oi is modest. The result of the output oi is fetched into the flip-flops FF1 and FF2 by a signal in which the clock is shifted by a predetermined amount of time. In the case where the output of the flip-flop FF1 and the output of the flip-flop FF2 show the same result, it is judged that the tilt of the output waveform of the output oi is within the predetermined amount of time, and the output value of the output oi is directly transmitted to the output port o of the comparator 1C5 as data. In the case where the output result of the flip-flop FF1 and the output result of the flip-flop FF2 are different to each other, it is judged that the tilt of the output waveform of the output of is not within the predetermined amount of time, in other words, the voltage difference value between the sample hold circuits SH1 and SH2 is judged to be very small. Then, an inversion value of information of a node 1C7 or a node 1C8 shown in FIG. 1C is outputted so that the value of the output voltage BN1 of the comparator 12B is converged. Thus, the comparator 1C5 can effectively avoid any false operation (metastable state) when the compared voltages are substantially equal to each other.

As described, according to the present preferred embodiment, the substrate voltage of the MOS element m1 for supplying the substrate voltage is set so that such a current value as takes into account a substrate dependency of the junction capacitance of the MOS element m1 for supplying the substrate voltage is obtained. Accordingly, a delay correction amount of each logical circuit, which is variable due to the variability of the power supply voltage, temperature and process, can be accurately set to such a desired set value that the variability is controlled.

Below is described a modified embodiment. FIGS. 2A and 2B show an example in which the characteristic detecting element m2 in the MOS element characteristic detecting circuit 20 is a gate capacitance. Accordingly, the delay correction can achieve a high accuracy in a state where the gate capacitance is dominant or a gate leakage is dominant among the load capacitances of the circuits.

The characteristic detecting element m2 in the MOS element characteristic detecting circuit 20 may be a wiring capacitance. Accordingly, the delay correction can achieve a high accuracy in a state where the wiring capacitance is dominant among the load capacitances of the circuits.

Figure 3:
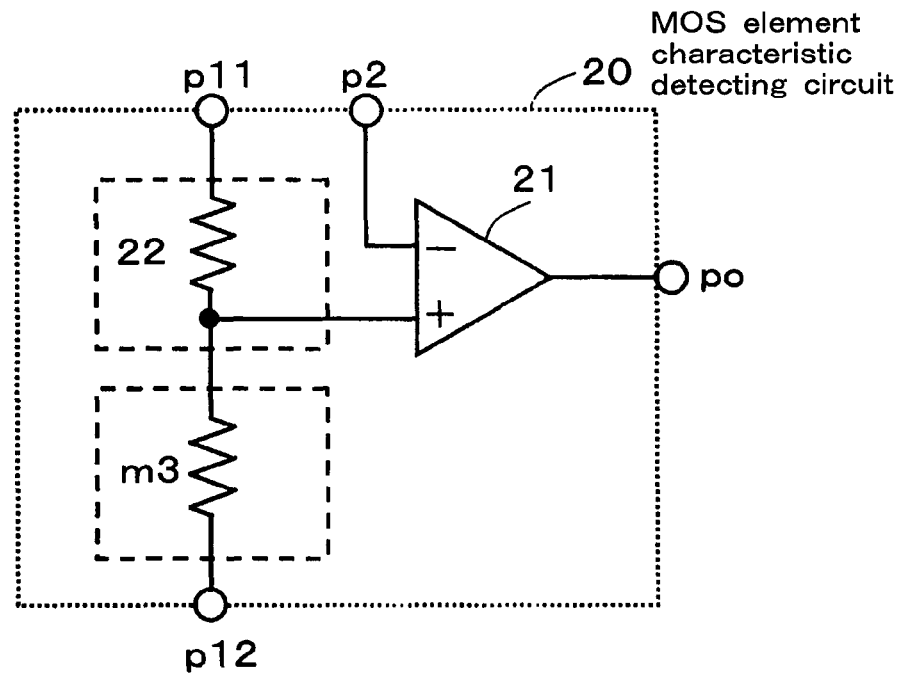
FIG. 3 is a circuit diagram of a circuit for detecting a wiring capacitance characteristic according to the preferred embodiment.

FIG. 3 shows an example in which a characteristic detecting element m3 in the MOS element characteristic detecting circuit 20 is metal wiring generated in the semiconductor manufacturing process. In the example, a resistance material 22 having a resistance accuracy previously guaranteed and the characteristic detecting element m3 are serially connected, ports p11 and p12 are fixedly set to a desired voltage, a voltage at a section where the resistance material 22 and the characteristic detecting element m3 are connected and a reference voltage of the port p2 previously set are compared to each other by the comparator 21, and a result of the comparison is transmitted to the variable current source 11. Accordingly, the delay correction can achieve a high accuracy in the semiconductor integrated circuit where the delay element resulting from the wiring capacitance is dominant among the delay elements of the circuit.

Figure 4:
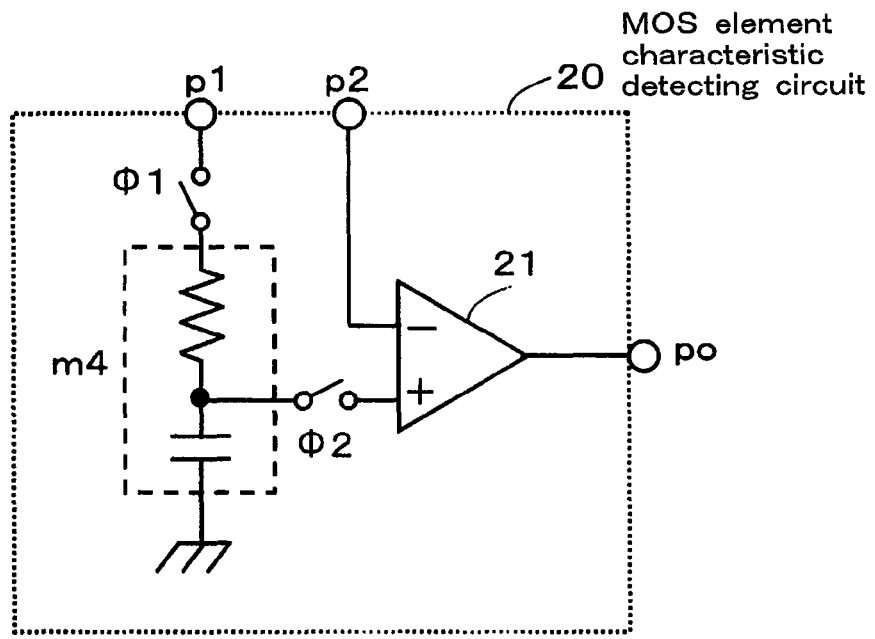
FIG. 4 is a circuit diagram of a circuit for detecting a wiring resistance characteristic according to the preferred embodiment.

FIG. 4 shows an example in which a characteristic detecting element m4 in the MOS element characteristic detecting circuit 20 is metal wiring and a metal capacitance generated in the semiconductor manufacturing process. The port p1 for supplying a desired voltage is connected to one end of the characteristic detecting element m4 via a switch controlled by the timing signal φ1, and the comparator 21 is connected to the other end thereof via a switch controlled by the timing signal φ2.

FIG. 5 shows an example in which a characteristic detecting element m5 constituting the first circuit is metal wiring generated in the semiconductor manufacturing process. The characteristic detecting element m5 is connected to between an output of a flip-flop 23 and an input of a flip-flop 24. It is compared by an expectation value comparator 26 whether or not the delays of the resistance and the capacitance stay within the phases of the timing signals φ1 and φ2 generated by a phase shift clock generating circuit 25, and a result of the comparison is transmitted to a phase control signal generating circuit 27. The phase control signal generating circuit 27 generates a phase control signal based on the comparison result and transmits the generated signal to the variable current source 11.

The output result of the flip-flop 24 is fetched into flip-flops 24A and 24B by a signal in which the timing signal φ2 is shifted by a predetermined amount of time. In FIG. 5, φ2+Δφ is inputted as a clock of the flip-flop 24A, and φ2+Δφ+Δφ1, which is further phase-shifted, is inputted as a clock of the flip-flop 24B. In the case where the outputs of the flip-flops 24A and 24B show the same result, it is judged that a tilt of an output waveform of the flip-flop 24 is within the predetermined amount of time, and a value of an output port o of the expectation value comparator 26 is directly transmitted as data. In the case where the output results of the flip-flops 24A and 24B are different to each other, it is judged that the tilt of the output waveform of the flip-flop 24 is not within the predetermined amount of time, in other words, the flip-flop 24 is in the metastable state. Then, an inversion value of the result of the expectation value comparator 26 is outputted and inputted to the phase control signal 27.

According to the constitutions shown in FIGS. 4 and 5, the delay correction in the semiconductor integrated circuit where the wiring delay is dominant among the delay components of the circuits can achieve a high accuracy.

Figure 6:
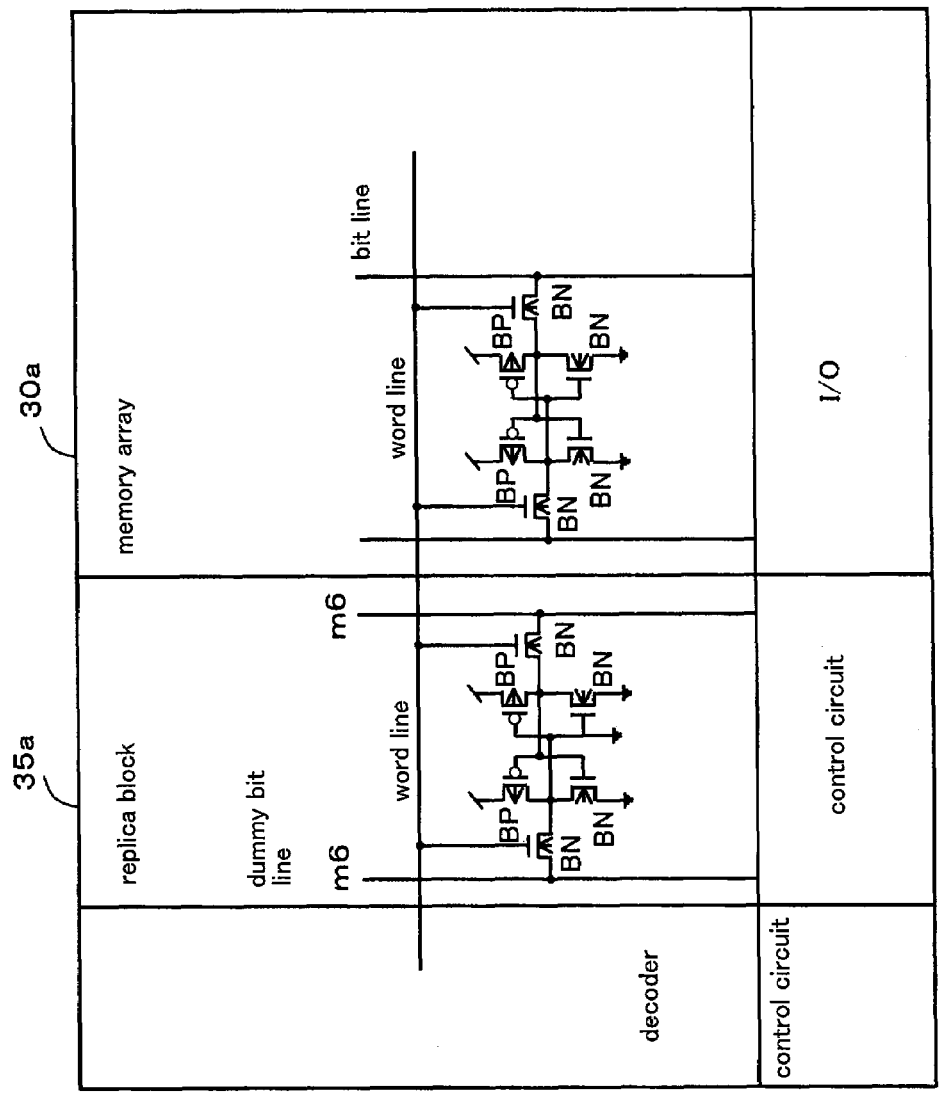
FIG. 6 is a circuit diagram of a circuit for detecting a replica element characteristic in the semiconductor integrated circuit according to the preferred embodiment.

FIG. 6 shows an example in which a dummy bit line in a replica block 35a of a memory circuit 30a constitutes a characteristic detecting element m6 in the MOS element characteristic detecting element 20. Accordingly, the delay can be accurately corrected in the semiconductor integrated circuit without the addition of an output load component of the circuit for realizing functions. As a result, the yielding percentage deteriorated due to the delay can be improved, any unnecessary design margin is eliminated so that the power consumption can be reduced, a circuit area can be reduced, and a higher processing speed can be achieved.

FIG. 7A shows an example in which a memory bit line of the memory circuit 30a constitutes a characteristic detecting element m7 in the MOS element characteristic detecting element 20. A power supply of an inverter 35b for driving a word line is VDP1, and a ground is VSM1. When the semiconductor integrated circuit 1 to be shipped is subjected to the inspection, the substrate voltages (BP, BN) set by the substrate voltage control circuit 10 in accordance with each temperature are applied to the respective PMOS and NMOS, and then, it is judged whether or not the writing/reading operation of the SRAM is normally performed based on the comparison result of the comparator. The judgment is made by the mode controller 50. When the comparison result shows that the reading operation fails to achieve a predetermined speed (writing/reading operation is abnormal), the mode controller 50 changes the reference current value of the NMOS substrate voltage control circuit. The changed set value (reference current value) is stored in the register of the mode controller 50. Further, the mode controller 50 changes a data input pattern with respect to the SRAM, and judges if the writing operation can be normally performed at a predetermined speed based on the comparison result of the comparator. When the comparison result shows that the writing operation fails to achieve the predetermined speed, the mode controller 50 increases the voltage of the inverter 35b for driving the word line. The inverter 35b is configured in such a manner that a maximum voltage value of the output signal can be changed. In the case where a performance of a transistor 35C whose gate is connected to the word line is made to be constant, in general, it is not possible to improve both of a reading margin (static noise margin) and a writing margin of the SRAM. Therefore, it is necessary to reduce the performance of the transistor 35C in order to improve the reading margin and increase the performance of the transistor 35C in order to improve the writing margin. In the voltage control of the inverter 35b described above, the performance of the transistor 35C is adjusted when the substrate voltage is changed. Accordingly, the correction can be realized in such a manner that the reading margin is prioritized or the reading speed is prioritized. Thus, the writing margin can be corrected based on the adjustment of the gate voltage.

According to the constitution and control shown in FIG. 7A, the delay correction in the semiconductor integrated circuit can be performed with a high accuracy by means of the information of the circuit element for realizing the actual functions. As a result, the yielding percentage deteriorated due to the delay can be improved, any unnecessary design margin is eliminated so that the power consumption can be reduced, the circuit area can be reduced, and the processing speed can be increased.

In order to reduce the leakage current of the SRAM, VSM1 may be set to a lower voltage, and VSM2 may be set to a higher voltage. In memory cells of the SRAM, the writing margin may be different in each row due to LER (line edge roughness, random difference of gate width), the fluctuation of an impurity concentration at a channel formation part of the MOS transistor, and the like. In such a case, the voltage of the word line of the SRAM may be set for every row. In the case where the reading margin is different at every row, the substrate voltage of the SRAM may be set for every row. In the case where the substrate voltage is similarly set in the column direction, a level of the optimization is improved. The row denotes a group of memory cells in parallel with the word line.

FIG. 7B shows an effective transistor-well arrangement in the foregoing improvement. As shown in FIG. 7B, the wells are horizontally separated, and the NMOS transistors in the column directions are in the same well region (P WELL). Accordingly, the substrate voltage value can be independently applied to each WELL (P WELL iti, P WELL 2, P WELL 3, P WELL 4). When the SRAM is halted, the bit line is set to 0 V, which reduces the gate leakage current from the bit line to the word line. The substrate voltage value BN1 generated by the comparator 12B of the substrate voltage control circuit shown in FIG. 1C is applied to the NMOS substrate BN of the SRAM. As described referring to FIG. 1C, the comparator 12B is operated at a certain voltage value or more and at a certain temperature or less, and is powered off in other ranges of the power supply and the temperature. The substrate voltage value BN1 is set to the lower-limit voltage value of the resistance tree 1C6.

Figure 8:
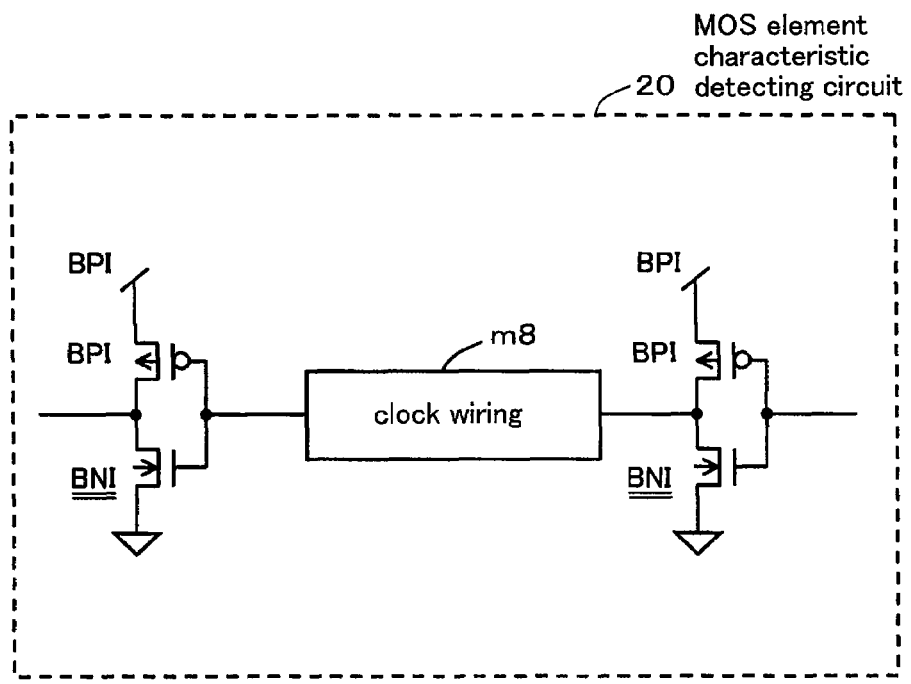
FIG. 8 is a circuit diagram of a circuit for detecting a characteristic of a clock-based element in the semiconductor integrated circuit according to the preferred embodiment.

FIG. 8 shows an example in which a characteristic detecting element m8 in the MOS element characteristic detecting circuit 20 is clock wiring of a clock buffer. Accordingly, a clock skew delay can be accurately corrected between the circuits which are clock-driven, in particular, between the circuits provided with a long wiring distance therebetween because they are very distant from each other, in the semiconductor integrated circuit. As a result, the yielding percentage deteriorated due to the delay can be improved, any unnecessary design margin is eliminated so that the power consumption can be reduced, the circuit area can be reduced, and the processing speed can be increased.

In the case where a strobe signal is transmitted along with bus data to a pass unit, wiring and a driver which form a strobe signal part are also corrected, which realizes a high-speed bus transfer. In the case where the clock buffer constitutes the logical circuit 30 of the functional block, the clock skew delay can be accurately corrected between the circuits which are clock-driven in the semiconductor integrated circuit. As a result, the yielding percentage deteriorated due to the delay can be improved, any unnecessary design margin is eliminated so that the power consumption can be reduced, the circuit area can be reduced, and the processing speed can be increased.

Figure 9:
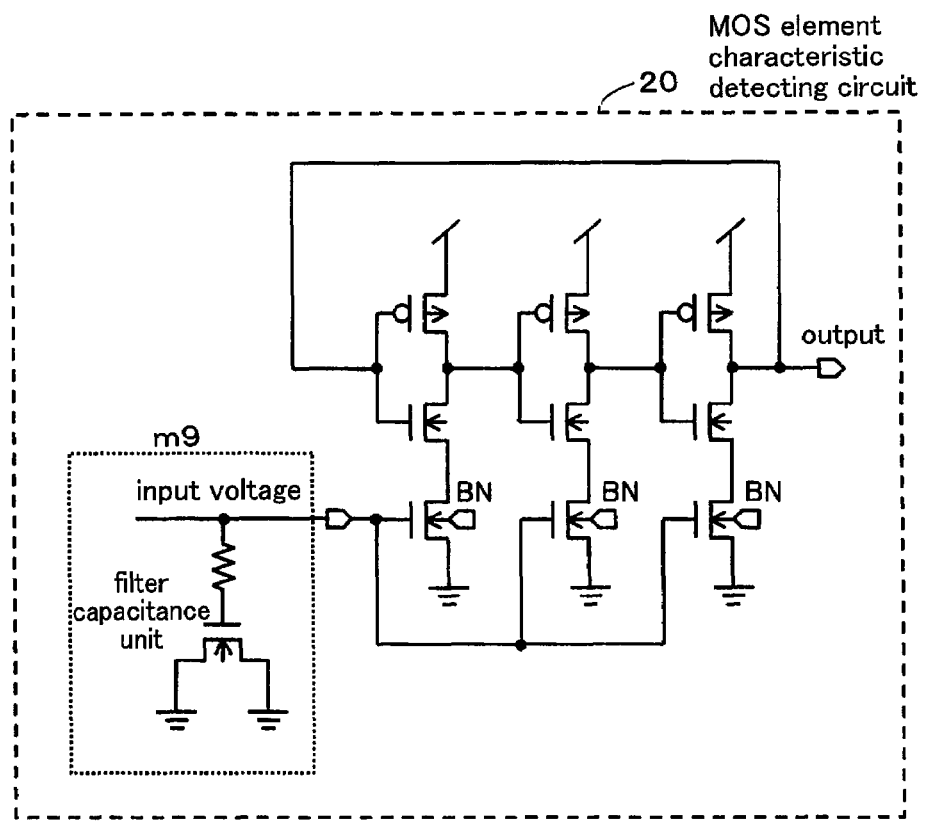
FIG. 9 is a circuit diagram of a circuit for detecting characteristics of a filter and a VCO-based element in the semiconductor integrated circuit according to the preferred embodiment.

FIG. 9 shows an example in which a characteristic detecting element m9 in the MOS element characteristic detecting circuit 20 is a capacitance unit of a filter. Accordingly, the delay correction and the improvement of the AC characteristic in the circuit having the analog function in the semiconductor integrated circuit, in particular, in the constitution where charges are supplied to the circuit, can be realized with a high accuracy. As a result, the yielding percentage deteriorated due to the delay and oscillation in the loop can be improved, any unnecessary design margin is eliminated so that the power consumption can be reduced, the circuit area can be reduced, and the processing speed can be increased.

In the case where a VCO circuit (voltage control oscillation circuit) constitutes the logical circuit 30 of the functional block, a clock frequency used in the semiconductor integrated circuit can be accurately stabilized.

FIG. 10 shows an example in which a characteristic detecting element m10 in the MOS element characteristic detecting circuit 20 is bus wiring. Accordingly, the delay can be corrected between the functional blocks in the semiconductor integrated circuit. As a result, the yielding percentage deteriorated due to the delay can be improved, any unnecessary design margin is eliminated so that the power consumption can be reduced, the circuit area can be reduced, and the processing speed can be increased.

In the case where the strobe signal is transmitted along with the bus data to the pass unit, the wiring and the driver which form the strobe signal part are also corrected, which realizes the speedy bus transfer.

In the case where a driver of the bus constitutes the logical circuit 30 of the functional block, the delay can be corrected between the functional blocks in the semiconductor integrated circuit. As a result, the yielding percentage deteriorated due to the delay can be improved, any unnecessary design margin is eliminated so that the power consumption can be reduced, the circuit area can be reduced, and the processing speed can be increased.

Figure 11:
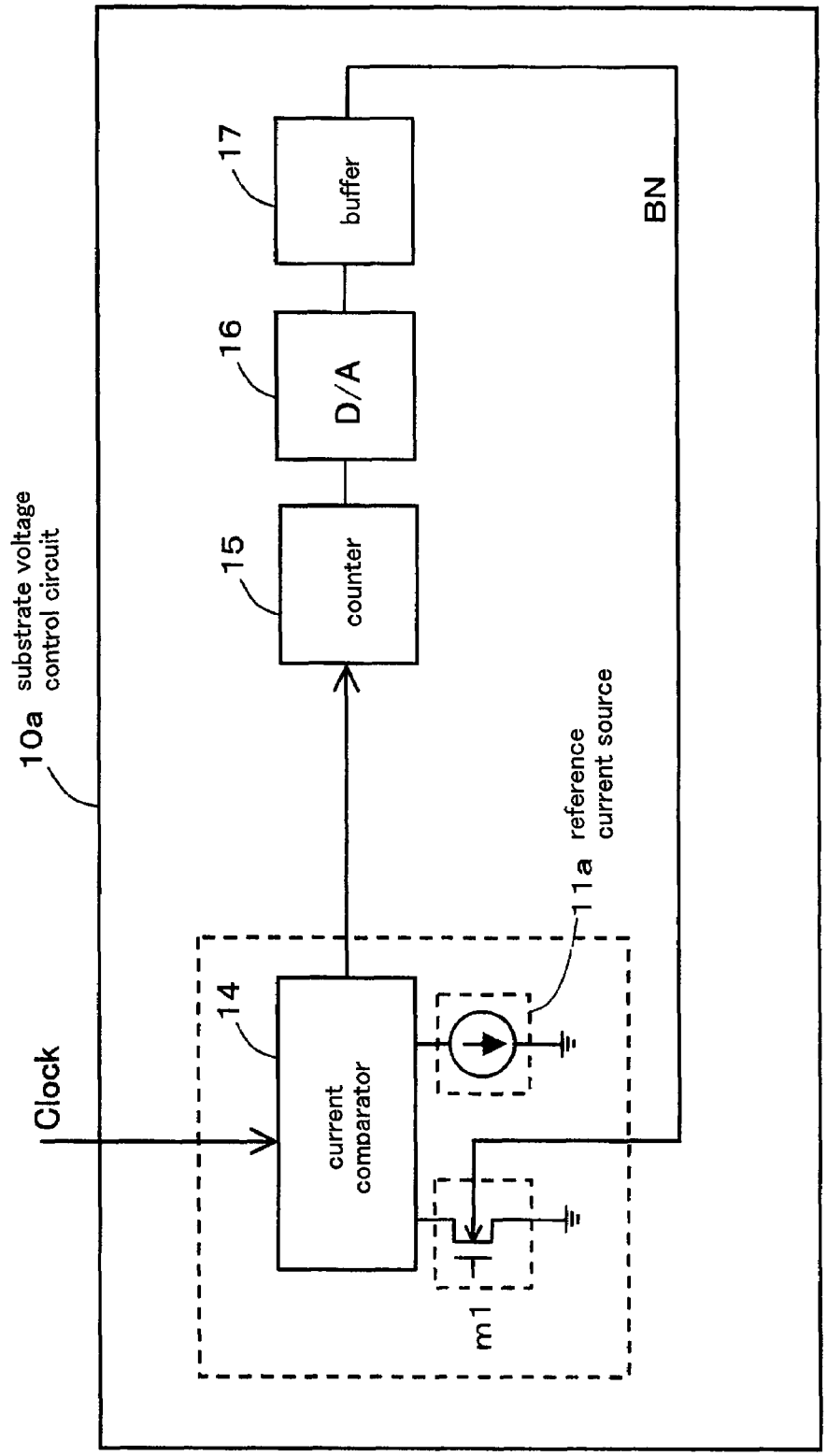
FIG. 11 is a block diagram illustrating a constitution of another substrate voltage control circuit in the semiconductor integrated circuit according to the preferred embodiment.

FIG. 11 shows an example of another substrate voltage control circuit 10a. The substrate voltage control circuit 10a comprises an MOS element m1 for supplying the substrate voltage, a reference current source 11a, a current comparator 14, a counter 15, a D/A converting circuit 16, and a buffer 17. A gate voltage of the MOS element m1 for supplying the substrate voltage is set to an arbitrary value. A drain output current of the MOS element m1 for supplying the substrate voltage and a reference current of the reference current source 11a are inputted to the current comparator 14 and compared to each other therein. A result of the comparison is inputted to the buffer 17 via the counter 15 and D/A converting circuit 16, and an output of the buffer 17 is thereafter connected to the substrate of the MOS element m1 for supplying the substrate voltage.

The current comparator 14 may be a current comparator provided with a latch function which is operated by an arbitrary frequency clock. Further, in the case where the comparator 1C1 shown in FIG. 1D constitutes the current comparator 14, the metastable state can be avoided, and the operation can be stabilized. In that case, it is important to input an output of an LSB part of the counter 15 to the comparator 1C1 in place of the node 1C7. The current comparator 14, counter 15 and D/A converting circuit 16 may be replaced with the circuit configuration 12A shown in FIG. 1C. In that case, the D/A converting circuit 16 is provided between the current comparator 14 and the buffer 17, and the output of the current comparator 14 provided with the latch function is connected to the D/A converting circuit 16. Accordingly, the comparison result of the current comparator 14 is outputted from the D/A converting circuit 16. Thus constituted, the oscillation resulting from the analog feedback is not generated in the substrate voltage BN of the MOS element m1 for supplying the substrate voltage, and the delay can be more accurately corrected.

The descriptions so far are based on the constitution wherein the component of the reference numeral 11 is the variable current source; however, a variable voltage source may constitute the reference voltage of the port p6 and the mixer 13. In this case, the delay correction with a high accuracy can also be realized.

In the case where the gate voltage of the MOS element m1 for supplying the substrate voltage is set to any voltage other than the power supply voltage, the delay can be accurately corrected without undermining noise margins of a dynamic circuit and a domino circuit resulting from threshold values in the semiconductor integrated circuit.

In the case where the variable current source 11 is adjusted in accordance with the power supply voltage value, a noise margin value in which the power supply voltage value is reflected can be realized without undermining the noise margins of the dynamic circuit and the domino circuit resulting from the threshold values in the semiconductor integrated circuit. As a result, the delay can be more accurately corrected.

When the reference voltage of the port p6 is adjusted in accordance with the power supply voltage value, the noise margin value in which the power supply voltage value is reflected can be realized without undermining the noise margins of the dynamic circuit and the domino circuit resulting from the threshold values in the semiconductor integrated circuit. As a result, the delay can be more accurately corrected.

When the output of the buffer 17 is set to a value in accordance with the power supply voltage, the noise margin value in which the power supply voltage value is reflected can be realized without undermining the noise margins of the dynamic circuit and the domino circuit resulting from the threshold values in the semiconductor integrated circuit. As a result, the delay can be more accurately corrected.

In the case where the variable current source 11 is variably controlled in a discrete manner via a switched capacitor circuit, the delay can be accurately corrected in the semiconductor integrated circuit. As a result, any factor of a noise generated in the MOS element characteristic detecting circuit during the delay correction can be eliminated, and the correcting operation can be stabilized. Further, the substrate voltage can be sequentially corrected, which realizes the delay correction with a high accuracy in a more stable manner.

A latch circuit may constitute the current comparator 14. Accordingly, the delay can be corrected at a higher speed.

An operator installed in the semiconductor integrated circuit may also serve as the current comparator 14. Accordingly, the present invention can be realized by a simplified digital circuit, which makes it unnecessary to use a complicated analog circuit. As a result, a designing process for accurate delay correction can be facilitated.

Software may constitute the comparator. Accordingly, the overhead of the correcting circuit is not generated in the semiconductor integrated circuit. As a result, the delay can be accurately corrected.

The semiconductor integrated circuit 1 may comprise the SOC (System on a Chip) function. Accordingly, the delay correction of the entire semiconductor integrated circuit can be controlled, and the delay can be thereby accurately corrected in a well-balanced manner.

The semiconductor integrated circuit may comprise a processor function. As a result, the delay can be accurately corrected while the performance of each processor in the semiconductor integrated circuit is maintained at the same time.

The substrate voltage control circuit 10 may be selectively executed when the operation frequency of the semiconductor integrated circuit is at least an arbitrary value. The arbitrary value is set to the operation frequency of the semiconductor integrated circuit as a threshold value for deciding whether or not the delay correction is executed in the semiconductor integrated circuit.

Thus controlled, the delay correction with a high accuracy can be selectively performed whenever the delay correction of the semiconductor integrated circuit is necessary, while the correcting circuit part can be halted whenever the delay is allowable, in other words, the delay correction is unnecessary. As a result, the power consumption can be reduced.

The substrate voltage control circuit 10 may be selectively executed when the operation frequency of the semiconductor integrated circuit is at most an arbitrary value. The arbitrary value is set to the operation frequency of the semiconductor integrated circuit as a threshold value for deciding whether or not the power consumption is reduced in the circuit.

Thus controlled, the delay can be selectively corrected with a high accuracy in the circuit of the semiconductor integrated circuits of which further reduction in power consumption is required due to the power supply control.

The MOS element characteristic detecting circuit 20 may be executed once every arbitrary period after the semiconductor integrated circuit is shipped. Accordingly, the delay resulting from the deterioration of the semiconductor integrated circuit over time can be accurately corrected. Further, the drain current corrector E2 is halted when the MOS element characteristic detecting circuit 20 is not executed so that the power consumption can be reduced.

The MOS element characteristic detecting circuit 20 may be selectively executed when the temperature of the semiconductor integrated circuit is at least an arbitrary value. The arbitrary value is set as a threshold value for distinguish the circuit having a positive temperature characteristic from any other circuit.

Accordingly, the delay correction can be performed with a high accuracy in the circuit having the positive temperature characteristic. Further, the drain current corrector E2 is halted at or below a certain temperature so that the power consumption can be reduced.

The MOS element characteristic detecting circuit 20 may be selectively executed when the temperature of the semiconductor integrated circuit is at most an arbitrary value. The arbitrary value is set as a threshold value for distinguishing the circuit having a negative temperature characteristic from any other circuit.

Accordingly, the delay correction can be performed with a high accuracy in the circuit having the negative temperature characteristic. Further, the drain current corrector E2 is halted at or more than a certain temperature so that the power consumption can be reduced.

The MOS element characteristic detecting circuit 20 may be selectively executed when the voltage of the semiconductor integrated circuit is at least an arbitrary value. The arbitrary value is set as a threshold value for judging whether or not the semiconductor integrated circuit operates at a high speed.

Accordingly, the delay can be selectively corrected with a high accuracy in the state where the semiconductor integrated circuit operates at a higher speed. Further, the corrector is halted at or below a certain voltage so that the power consumption can be reduced.

The MOS element characteristic detecting circuit 20 may be selectively executed when the voltage of the semiconductor integrated circuit is at most an arbitrary value. The arbitrary value is set as a threshold value for judging whether or not the semiconductor integrated circuit operates at a high speed.

Accordingly, the delay can be selectively corrected with a high accuracy in the state where the semiconductor integrated circuit operates at a lower speed. Further, the corrector is halted at or more than a certain voltage so that the power consumption can be reduced.

The MOS element characteristic detecting circuit 20 may be selectively executed when the activation rate of the semiconductor integrated circuit is at least an arbitrary value. The arbitrary value is set as a threshold value for judging if the voltage drop is generated in the semiconductor integrated circuit.

Accordingly, the delay can be selectively corrected in the state where the delay resulting from the voltage drop is increased in the semiconductor integrated circuit.

The MOS element characteristic detecting circuit 20 may be selectively executed when the functional block of the semiconductor integrated circuit starts its operation. Accordingly, the delay correction of the functional block of the semiconductor integrated circuit is performed only when the functional block of the semiconductor integrated circuit for which the delay correction is necessary is nonoperational.

The MOS element characteristic detecting circuit 20 may be powered off during halts. Accordingly, the leakage current of the semiconductor integrated circuit is reduced, which realizes the delay correction with a higher accuracy.

The MOS element characteristic detecting circuit 20 may be controlled so that the detected value is retained during halts. Accordingly, the delay correction can speedily start when activated, which realizes the delay correction with a higher accuracy.

Commonality may be provided between the drive voltage of the substrate voltage control circuit 10 and the power supply voltage of the logical circuit. Accordingly, the voltage PAD and the wiring resource of another power supply in the semiconductor integrated circuit can be reduced. As a result, the circuit area can be further reduced.

The present invention was so far described mainly referring to the control of the MOS substrate voltage in relation to the MOS transistor of the single gate. However, when the present invention is applied to the MOS transistor of the multiple gate (double gate), one of the gates in the double gate is controlled in the same manner. As a result, a similar effect can be obtained.

While there has been described what is at present considered to be preferred embodiments of this invention, it will be understood that various modifications may be made therein, and it is intended to cover in the appended claims all such modifications as fall within the true spirit and scope of this invention.

The semiconductor integrated circuit according to the present invention is very useful as a semiconductor chip comprising a CPU, and is also applicable to a chip set in which the chip is used. Further, these can be applied to a mobile telephone, an IC card chip and the like. Further, an electronic appliance provided with the semiconductor integrated circuit according to the present invention can be environment-friendly.

What is claimed is:

1. A semiconductor integrated circuit comprising:
   a substrate voltage control circuit comprising at least a MOS element for supplying a substrate voltage for controlling the supply of the substrate voltage of the semiconductor integrated circuit;
   a drain current setter having a current source connected to the MOS element for adjusting a drain current of the MOS element for supplying the substrate voltage by controlling the substrate voltage of the MOS element for supplying the substrate voltage;
   a MOS element characteristic detecting circuit comprising a characteristic detecting element for detecting a characteristic of the MOS element for supplying the substrate voltage; and
   a drain current corrector for correcting the drain current of the MOS element for supplying the substrate voltage by controlling the current source for supplying the substrate voltage in accordance with the characteristic of the MOS element for supplying the substrate voltage detected by the MOS element characteristic detecting circuit,
   wherein the MOS element characteristic detecting circuit comprises a comparator for comparing an output of the characteristic detecting element to a reference value, and
   wherein the MOS element characteristic detecting circuit detects the characteristic of the MOS element for supplying the substrate voltage based on a result of the comparison by the comparator.

2. The semiconductor integrated circuit as claimed in claim 1, wherein the characteristic detecting element is a capacitance element.

3. The semiconductor integrated circuit as claimed in claim 2, wherein the capacitance element is a junction capacitance.

4. The semiconductor integrated circuit as claimed in claim 2, wherein the capacitance element is a wiring capacitance.

5. The semiconductor integrated circuit as claimed in claim 2, further comprising a memory, wherein the wiring capacitance is a dummy bit line of the memory.

6. The semiconductor integrated circuit as claimed in claim 1, wherein the characteristic detecting element is a gate capacitance.

7. The semiconductor integrated circuit as claimed in claim 1, wherein the characteristic detecting element is a wiring resistance.

8. The semiconductor integrated circuit as claimed in claim 1, wherein a wiring capacitance and a resistance constitutes the characteristic detecting element.

9. The semiconductor integrated circuit as claimed in claim 1, further comprising a replica block in which at least a part of the semiconductor integrated circuit is replicated, wherein the characteristic detecting element is provided in the replica block.

10. The semiconductor integrated circuit as claimed in claim 1, wherein the MOS element characteristic detecting circuit detects the characteristic of the MOS element for supplying the substrate voltage based on information obtained when charges are supplied to the characteristic detecting element during an arbitrary period.

11. The semiconductor integrated circuit as claimed in claim 1, wherein
   the MOS element characteristic detecting circuit further comprises a resistance element serially connected to the characteristic detecting element, wherein
   the comparator secures both ends of the resistance element to arbitrary voltages different to each other, and compares a voltage at a section where the characteristic detecting element and the resistance element are connected to each other to the reference voltage.

12. The semiconductor integrated circuit as claimed in claim 1, wherein the comparator supplies charges to one end of the characteristic detecting element, and compares a time period necessary for another end to reach an arbitrary voltage to a reference time period.

13. The semiconductor integrated circuit as claimed in claim 1, wherein the comparator secures both ends of the characteristic detecting element to arbitrary voltages different to each other, and compares the current value at one of the ends of the characteristic detecting element to the reference current.

14. The semiconductor integrated circuit as claimed in claim 1, wherein the semiconductor integrated circuit is divided into blocks comprising arbitrary functions.

15. The semiconductor integrated circuit as claimed in claim 1, wherein the semiconductor integrated circuit comprises a SOC function.

16. The semiconductor integrated circuit as claimed in claim 1, wherein the semiconductor integrated circuit comprises a processor function.

17. The semiconductor integrated circuit as claimed in claim 1, wherein the drain current corrector starts a correction after the drain current setter completes the setting of the drain current of the MOS element for supplying the substrate voltage in an arbitrary state of the MOS element for supplying the substrate voltage.

18. The semiconductor integrated circuit as claimed in claim 1, wherein
the drain current corrector further comprises a memory device in which correction information is stored, wherein
the drain current corrector executes a correction in a shipping inspection of the semiconductor integrated circuit and stores information of the correction in the memory device.

19. The semiconductor integrated circuit as claimed in claim 1, wherein the drain current corrector executes a correction when an operation frequency of the semiconductor integrated circuit is at least an arbitrary value.

20. The semiconductor integrated circuit as claimed in claim 1, wherein the drain current corrector executes a correction when an operation frequency of the semiconductor integrated circuit is at most an arbitrary value.

21. The semiconductor integrated circuit as claimed in claim 1, wherein the drain current corrector executes a correction once every each arbitrary period after the semiconductor integrated circuit is shipped.

22. The semiconductor integrated circuit as claimed in claim 1, wherein the drain current corrector executes a correction when a temperature of the semiconductor integrated circuit is at least an arbitrary value.

23. The semiconductor integrated circuit as claimed in claim 1, wherein the drain current corrector executes a correction when a temperature of the semiconductor integrated circuit is at most an arbitrary value.

24. The semiconductor integrated circuit as claimed in claim 1, wherein the drain current corrector executes a correction when a voltage of the semiconductor integrated circuit is at least an arbitrary value.

25. The semiconductor integrated circuit as claimed in claim 1, wherein the drain current corrector executes a correction when a voltage of the semiconductor integrated circuit is at most an arbitrary value.

26. The semiconductor integrated circuit as claimed in claim 1, wherein the drain current corrector executes a correction when an activation rate of the semiconductor integrated circuit is at least an arbitrary value.

27. The semiconductor integrated circuit as claimed in claim 1, wherein the drain current corrector executes a correction when a functional block of the semiconductor integrated circuit starts to operate.

28. The semiconductor integrated circuit as claimed in claim 1, wherein the drain current corrector turns off its own power supply when a correction process is halted.

29. The semiconductor integrated circuit as claimed in claim 1, wherein the drain current corrector retains a value detected by the MOS element characteristic detecting circuit when its correction process is halted.

30. The semiconductor integrated circuit as claimed in claim 1, further comprising:
a PAD for external connection; and
a signal wire for transmitting a value detected by the MOS element characteristic detecting circuit to the drain current corrector, wherein
the signal wire is connected to the PAD.

31. The semiconductor integrated circuit as claimed in claim 1, wherein the drain current corrector comprises a self-test function.

32. The semiconductor integrated circuit as claimed in claim 1, further comprising a memory block, wherein the drain current corrector is provided in the memory block.

33. The semiconductor integrated circuit as claimed in claim 1, wherein
commonality is provided between a power supply voltage of the drain current setter and a power supply voltage of the MOS element characteristic detecting circuit.

34. A semiconductor integrated circuit comprising:
a substrate voltage control circuit comprising at least a MOS element for supplying a substrate voltage for controlling the supply of the substrate voltage of the semiconductor integrated circuit;
a drain current setter having a current source connected to the MOS element for adjusting a drain current of the MOS element for supplying the substrate voltage by controlling the substrate voltage of the MOS element for supplying the substrate voltage;
a MOS element characteristic detecting circuit comprising a characteristic detecting element for detecting a characteristic of the MOS element for supplying the substrate voltage;
a drain current corrector for correcting the drain current of the MOS element for supplying the substrate voltage by controlling the current source for supplying the substrate voltage in accordance with the characteristic of the MOS element for supplying the substrate voltage detected by the MOS element characteristic detecting circuit; and
a memory,
wherein the characteristic detecting element is a functional element of the semiconductor integrated circuit, and the functional element is a bit line of the memory.

* * * * *